United States Patent
Ehara et al.

[11] Patent Number: 5,905,418
[45] Date of Patent: May 18, 1999

[54] SURFACE-ACOUSTIC-WAVE FILTERS WITH POLES OF ATTENUATION CREATED BY IMPEDANCE CIRCUITS

[75] Inventors: Hisanori Ehara; Kazushige Noguchi; Hajime Shimamura; Yoshio Okada; Tomokazu Komazaki, all of Tokyo, Japan

[73] Assignee: Oki Electric Industry Co., Ltd., Tokyo, Japan

[21] Appl. No.: 08/993,580

[22] Filed: Dec. 18, 1997

[30] Foreign Application Priority Data

Feb. 12, 1997 [JP] Japan ................................. 9-027602
Apr. 23, 1997 [JP] Japan ................................. 9-105859

[51] Int. Cl.$^6$ .................................................. H03H 9/64
[52] U.S. Cl. ........................... 333/193; 333/133; 333/195
[58] Field of Search ................................. 333/193–196, 333/133; 310/313 R, 313 B, 313 C, 313 D

[56] References Cited

U.S. PATENT DOCUMENTS 5,506,552  4/1996  Seki et al. .......................... 333/194 X
5,559,481  9/1996  Satoh .................................... 333/133
5,592,135  1/1997  Taguchi et al. ....................... 333/193
5,610,566  3/1997  Chen et al. ........................... 333/194

FOREIGN PATENT DOCUMENTS 6-164309  6/1994  Japan ................................... 333/193

OTHER PUBLICATIONS

Fink et al., "Electronics Engineers' Handbook" McGraw Hill, 1989, pp. 3–27 to 3–29.

*Primary Examiner*—Robert Pascal
*Assistant Examiner*—Barbara Summons
*Attorney, Agent, or Firm*—Weneroth,Lind & Ponack,L.L.P.

[57] ABSTRACT

A surface-acoustic-wave filter couples a two-port surface-acoustic-wave resonator filter circuit coupled in parallel or in series with a two-port impedance circuit. The two-port impedance circuit has an impedance that creates a pole of attenuation, by making the open-circuit impedance of the surface-acoustic-wave filter equal to the short-circuit impedance. High attenuation over a wide range of stopband frequencies is obtained in this way, combined with steep roll-off between the passband and stopband.

28 Claims, 24 Drawing Sheets

FIG.20

| $L_O$ (nH) | FREQUENCY CHARACTERISTICS | | | | IMPEDANCE CHARACTERISTICS | | | | | |
|---|---|---|---|---|---|---|---|---|---|---|
| | 823 MHz | 849 MHz | 869 MHz | 895 MHz | 889 MHz | | 895 MHz | | 901 MHz | |
| | | | | | $Z_S$ | $Z_O$ | $Z_S$ | $Z_O$ | $Z_S$ | $Z_O$ |
| 0 | 1.65 dB | 1.15 dB | 46.9 dB | 25.7 dB | -j2.61 | -j3.35 | -j2.28 | -j3.00 | -j2.12 | -j2.84 |
| 4.0 | 1.13 dB | 1.19 dB | 46.0 dB | 38.8 dB | -j2.61 | -j2.91 | -j2.28 | -j2.55 | -j2.12 | -j2.39 |

SURFACE-ACOUSTIC-WAVE FILTERS WITH POLES OF ATTENUATION CREATED BY IMPEDANCE CIRCUITS

BACKGROUND OF THE INVENTION

The present invention relates generally to surface-acoustic-wave filters having poles, and more particularly to surface-acoustic-wave filters of the resonator type used, for example, in mobile communications equipment.

Like integrated circuits, surface-acoustic-wave filters, referred to below as SAW filters, are small and lightweight, and can easily be mass-produced. For these reasons, SAW filters are widely used as radio-frequency (RF) filters in devices such as portable telephone sets and pagers.

A portable telephone set of the code division multiple access (CDMA) type, for example, transmits in one frequency band and receives in an adjacent frequency band. The set accordingly requires an antenna duplexer with a pair of filters, one filter passing frequencies in the transmitting band and rejecting frequencies in the receiving band, while the other filter performs the opposite function. Each filter which must provide low passband insertion loss, steep roll-off between the passband and the adjacent stopband, and high attenuation across the full width of the stopband. These requirements are conventionally met by the use of a ladder filter, comprising one or more series-arm SAW resonators and one or more shunt-arm SAW resonators, with stopband attenuation produced by poles in the filter's transfer function.

As increasing performance demands are placed on mobile communications equipment, however, it is becoming difficult to meet the above requirements satisfactorily with a SAW ladder filter. One reason is that the passband width, insertion loss, stopband attenuation, and steepness of the roll-off depend on the properties of the piezoelectric substrate on which the SAW resonators are formed. Providing wide stopbands with the necessary high attenuation is particularly difficult.

These problems are difficult to solve by using the relationships between the passband and stopbands and the resonant frequencies (series resonance frequencies) and antiresonant frequencies (parallel resonance frequencies) of the SAW resonators in a SAW ladder filter, because of restrictions on the width, placement, and spacing of the passband and stopbands. It is particularly difficult to place wide stopbands with high attenuation close to the passband and still maintain a low insertion loss in the passband.

SUMMARY OF THE INVENTION

A general object of the present invention is to improve the frequency characteristics of SAW ladder filters having poles.

A more specific object is to obtain high stopband attenuation over a wide range of stopband frequencies.

A further object is to obtain steep roll-off between the passband and stopband.

According to a first aspect of the invention, a surface-acoustic-wave filter comprises a two-port surface-acoustic-wave resonator filter circuit and a two-port impedance circuit, coupled in parallel. The two-port surface-acoustic-wave resonator filter circuit has a phase shifter, at least one series-arm surface-acoustic-wave resonator, and at least one shunt-arm surface-acoustic-wave resonator. The two-port impedance circuit has an impedance that creates a pole of attenuation, by making the open-circuit impedance of the surface-acoustic-wave filter equal to the short-circuit impedance.

According to a second aspect of the invention, a surface-acoustic-wave filter comprises a two-port surface-acoustic-wave resonator filter circuit and a two-port impedance circuit, coupled in series. The two-port surface-acoustic-wave resonator filter circuit has two series-arm surface-acoustic-wave resonators and two shunt-arm surface-acoustic-wave resonators. As in the first aspect, the two-port impedance circuit has an impedance that creates a pole of attenuation, by making the open-circuit impedance of the surface-acoustic-wave filter equal to the short-circuit impedance.

In both aspects of the invention, the pole of attenuation created by the impedance circuit improves the frequency characteristic of the filter by increasing the stopband attenuation, enabling a high attenuation to be obtained over a wide range of stopband frequencies, with steep roll-off between the passband and stopband.

BRIEF DESCRIPTION OF THE DRAWINGS

In the attached drawings:

FIG. 20 summarizes the comparison in FIG. 19;

DETAILED DESCRIPTION OF THE INVENTION

Embodiments of the invention will be described with reference to the attached illustrative drawings.

Figure 1:
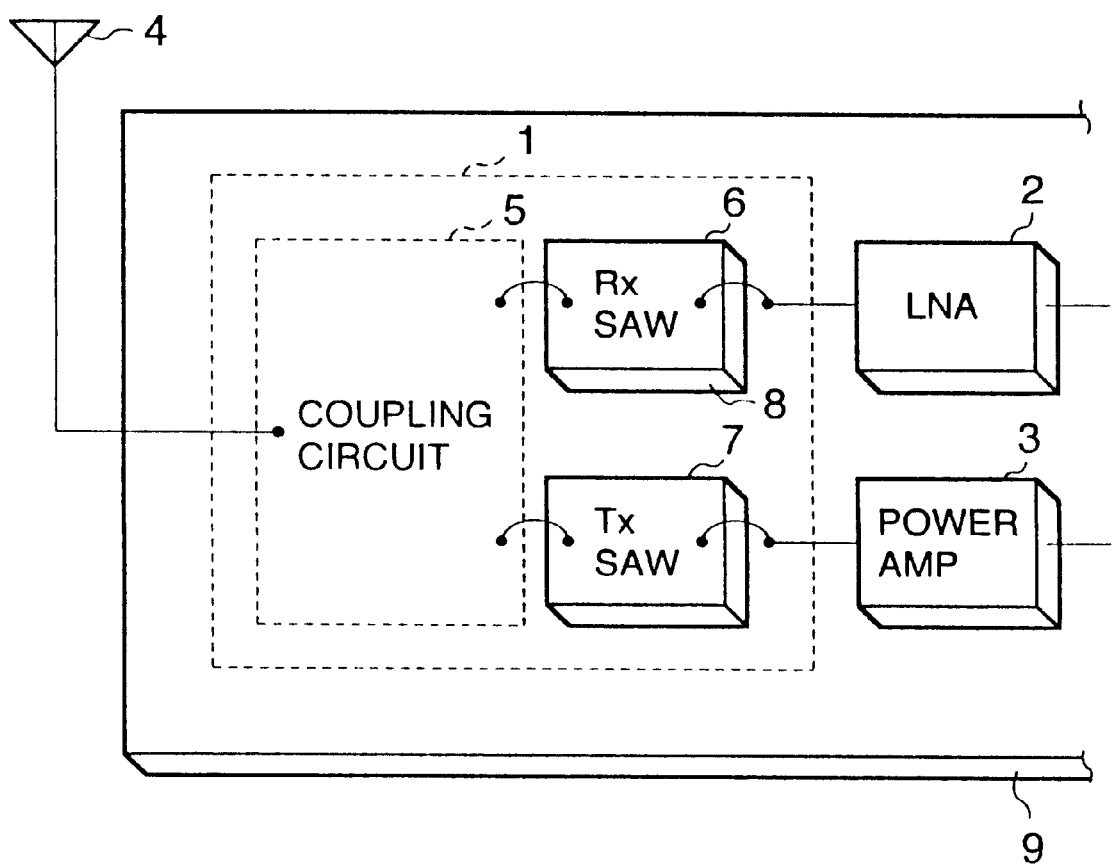
FIG. 1 is a perspective drawing of the front-end section of a wireless communication device.

As an example of a system in which the invention can be practiced, FIG. 1 shows part of the RF section of a portable CDMA telephone set, comprising an antenna duplexer 1, low-noise amplifier (LNA) 2, power amplifier (AMP) 3, and other circuits (not visible). The antenna duplexer 1, which is the interface between the amplifiers 2 and 3 and an antenna 4, comprises a coupling circuit 5, a receiving (Rx) SAW filter 6, and a transmitting (Tx) SAW filter 7. The coupling circuit 5 comprises interconnecting lines and other components such as inductors and capacitors, not explicitly shown in the drawing. The receiving SAW filter 6 comprises a plurality of SAW resonators having metal-foil interdigital transducers formed on a piezoelectric substrate 8. The transmitting SAW filter 7 has a similar structure, details of which will be shown later. All of these components are mounted on a main substrate 9, such as a ceramic substrate or glass-epoxy substrate.

This telephone set transmits in, for example, a frequency band from eight hundred twenty-four megahertz to eight hundred forty-nine megahertz (824 MHz to 849 MHz), and receives in a frequency band from 869 MHz to 894 MHz. The transmitting SAW filter 7 preferably has an insertion loss of 1.5 decibels (dB) or less in the transmitting band, and an attenuation of at least 35 dB in the receiving band. The receiving SAW filter 6 preferably has an insertion loss of 4 dB or less in the receiving band, and an attenuation of at least 50 dB in the transmitting band.

FIRST EMBODIMENT

Figure 2:
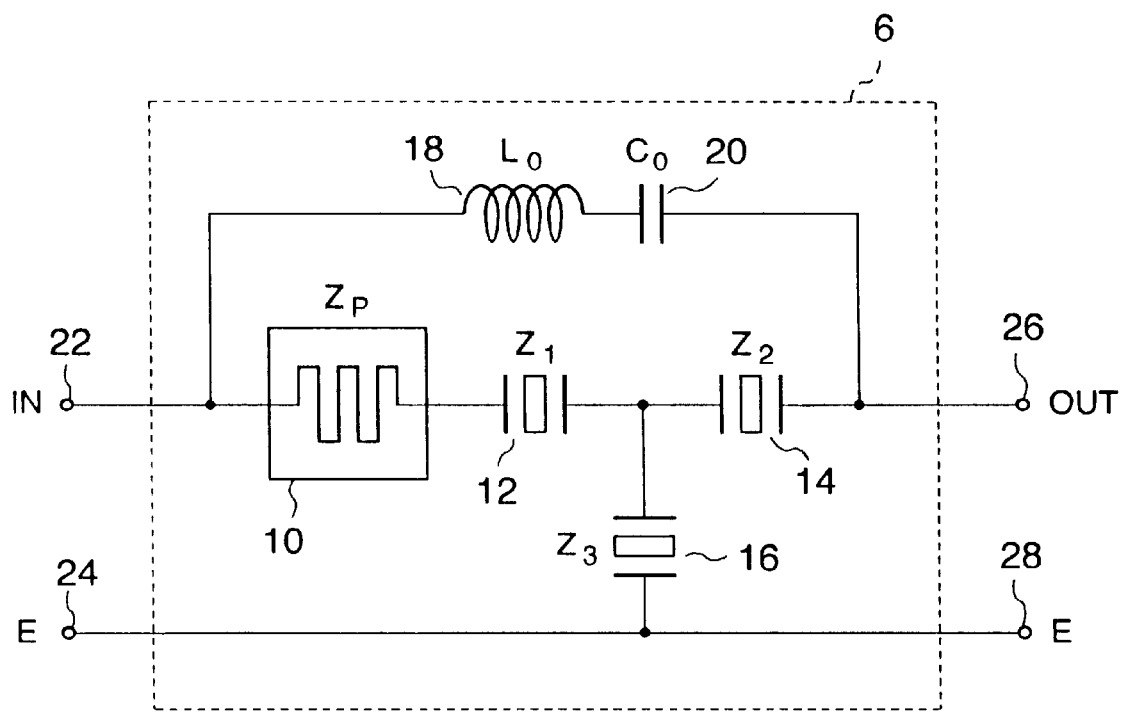
FIG. 2 is a schematic diagram of a first embodiment of the invention, suitable for use as the receiving SAW filter in FIG. 1.

The first embodiment of the invention is a SAW filter suitable for use as the receiving filter 6 in FIG. 1. Referring to FIG. 2, this embodiment of the receiving filter 6 comprises a phase shifter 10, a pair of series-arm SAW resonators 12 and 14, a shunt-arm SAW resonator 16, an inductor 18, and a capacitor 20. These elements form a two-port circuit, the input port comprising an input terminal 22 and ground or earth (E) terminal 24, and the output port comprising an output terminal 26 and ground terminal 28.

The phase shifter 10 and series-arm SAW resonators 12 and 14 are coupled in series between the input terminal 22 and output terminal 26. The inductor 18 and capacitor 20 are also coupled in series between the input terminal 22 and output terminal 26, in parallel with the phase shifter 10 and series-arm SAW resonators 12 and 14. The shunt-arm SAW resonator 16 is coupled, on one side, to a node disposed between the two series-arm SAW resonators 12 and 14, and on the other side to the ground terminals 24 and 28.

The phase shifter 10 and SAW resonators 12, 14, and 16 are formed on a common piezoelectric substrate. The phase shifter 10 comprises a stripline with a total length of eleven centimeters (11 cm). Each of the two series-arm SAW resonators 12 and 14 comprises an interdigital transducer with one hundred pairs of electrode fingers that mesh over a distance, referred to as an aperture, of fifty micrometers (50 $\mu$m). The shunt-arm SAW resonator 16 comprises an interdigital transducer with eighty-six pairs of interdigital fingers and an aperture of 86 $\mu$m. The phase shifter 10 has a certain impedance $Z_P$. The SAW resonators 12, 14, and 16 have respective impedances $Z_1$, $Z_2$, and $Z_3$. The inductor 18 comprises a bonding wire with an inductance $L_0$ of three nanohenries (3.0 nH). The capacitor 20 has a capacitance $C_0$ of, for example, 0.1 picofarad (0.1 pF).

The first embodiment is a two-stage SAW filter. The first stage comprises series-arm SAW resonator 12 and shunt-arm SAW resonator 16. The second stage comprises shunt-arm SAW resonator 16 and series-arm SAW resonator 14. In SAW filters in general, each adjacent pair of series- and shunt-arm SAW resonators constitutes one stage of the filter.

Figure 3:
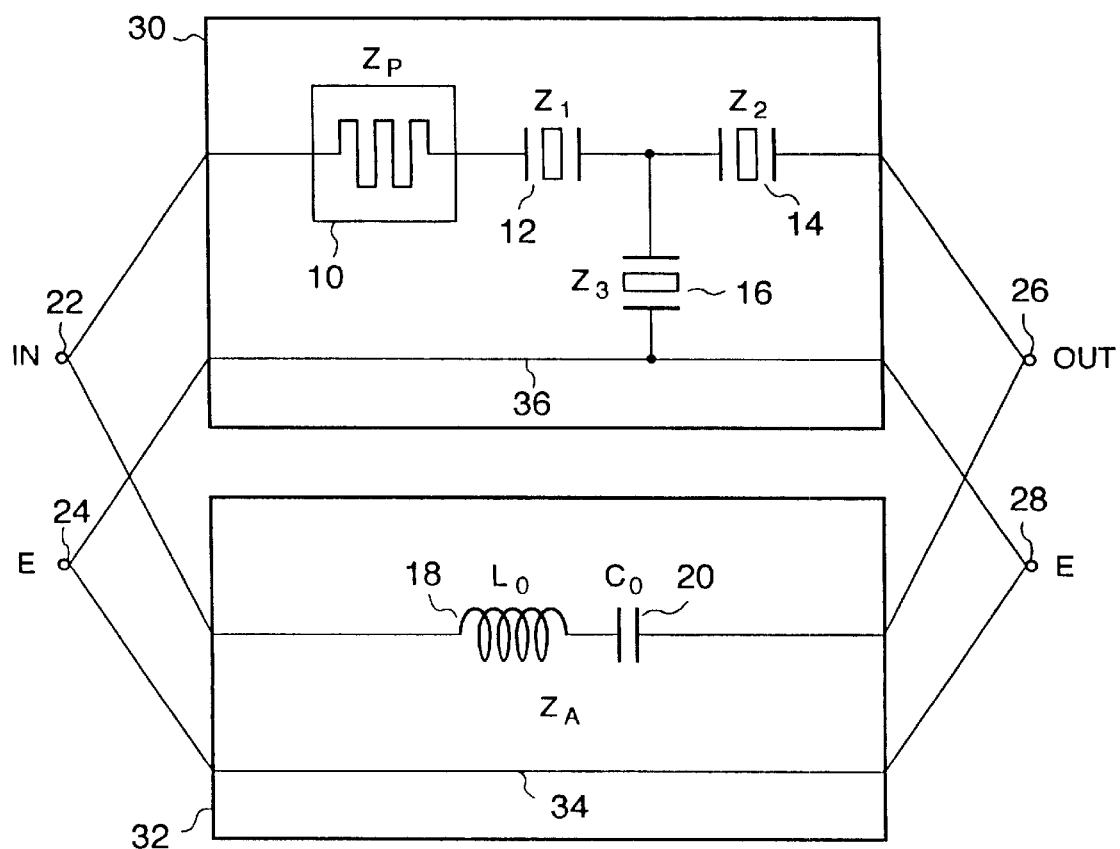
FIG. 3 shows FIG. 2 redrawn as a pair of two-port circuits coupled in parallel.

Referring to FIG. 3, this filter circuit can also be described as comprising a pair of two-port circuits coupled in parallel between the input terminal 22 and output terminal 26, and between the ground terminals 24 and 28. One two-port circuit is a SAW filter circuit 30 comprising the phase shifter 10 and SAW resonators 12, 14, and 16. The other two-port circuit is an impedance circuit 32 comprising the inductor 18 and capacitor 20, and a ground line 34. For an input signal with a frequency f and angular frequency $\omega$ equal to $2\pi f$, the inductor 18 and capacitor 20 combine to provide the impedance circuit 32 with an impedance $Z_A$ equal to $j\omega L_0 + 1/(j\omega C_0)$, where j represents the square root of minus one.

The two-port description of the impedance circuit 32 is useful in computing the frequency characteristic of the filter. The parallel connection, for example, means that the admittance matrices of the two-port circuits 30 and 32 combine additively. In the general case, the two-port circuit 32 may have various configurations other than those shown in FIG. 3, some of which will be illustrated later.

Next, the operation of this embodiment will be described.

The operation of the circuit in FIG. 2 can be analyzed by calculating the impedance $Z_O$ between the input terminal 22 and ground terminal 24 when the output terminal 26 and ground terminal 28 are open-circuited, and the impedance $Z_S$ between the input terminal 22 and ground terminal 24 when the output terminal 26 and ground terminal 28 are short-circuited. $Z_O$ and $Z_S$ can also be given in terms of ABCD transfer parameters, $Z_O$ being equal to A/C and $Z_S$ to B/D. Definitions of the ABCD parameters can be found in, for example, the Electronics Engineer's Handbook edited by Fink et al., published by McGraw-Hill.

The quantities $Z_O$ and $Z_S$ depend on the angular frequency $\omega$ of the input signal. When expressed in decibels, the frequency characteristic $\alpha(\omega)$ of the circuit in FIG. 2 is given by the following equation (1), in which Log represents the logarithm.

$$\alpha(\omega) = 20.0 \times \text{Log} \left| \frac{(1+Z_O)(1+Z_S)}{(Z_O - Z_S)} \right| \quad (1)$$

It can be seen that this frequency characteristic has poles at frequencies at which $Z_O$ is infinite, at frequencies at which $Z_S$ is infinite, and at frequencies at which $Z_O$ is equal to $Z_S$. The last case is of interest here.

Figure 4:
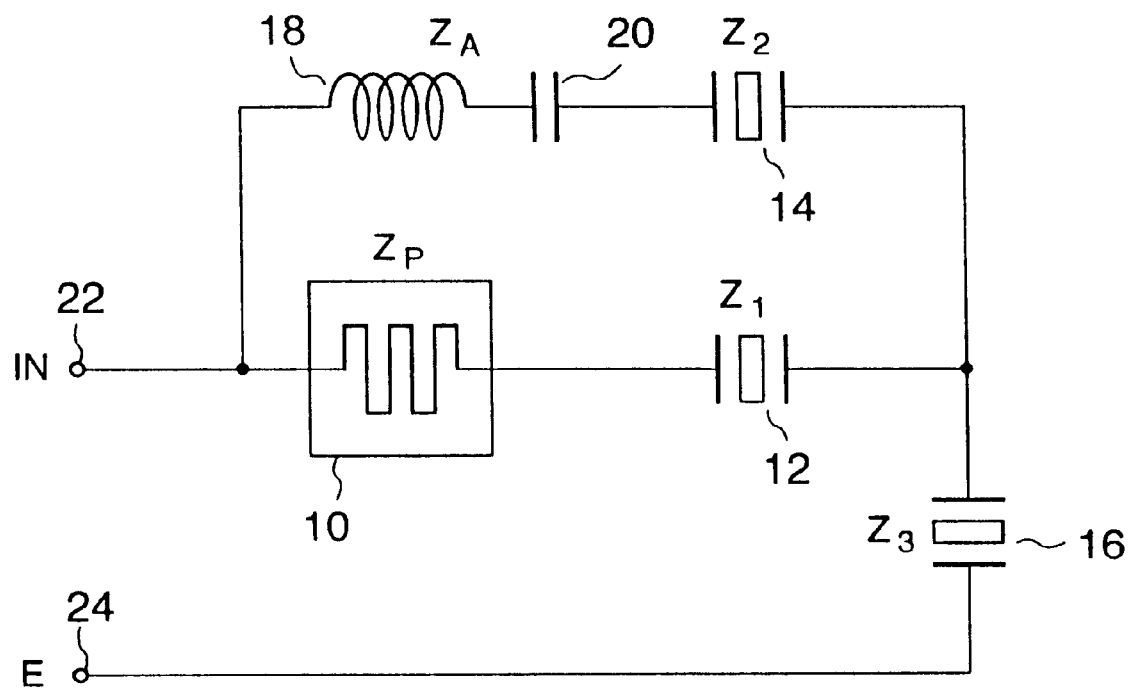
FIG. 4 shows FIG. 2 redrawn for the case of open-circuited output terminals.

The open-circuited configuration can be redrawn as shown in FIG. 4. It can be seen that $Z_O$ has the following value.

$$Z_O = \frac{(Z_A + Z_2)(Z_P + Z_1)}{Z_A + Z_P + Z_1 + Z_2} + Z_3 \quad (2)$$

Figure 5:
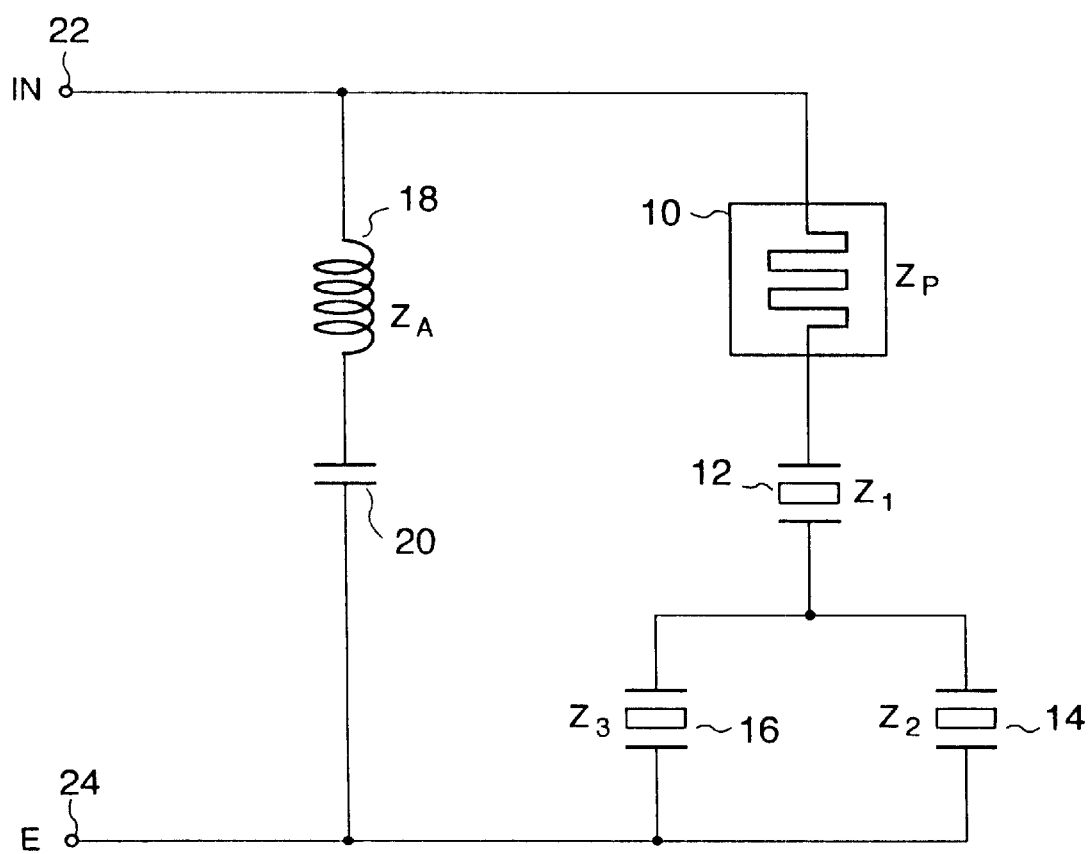
FIG. 5 shows FIG. 2 redrawn for the case of short-circuited output terminals.

The short-circuited configuration can be redrawn as shown in FIG. 5. It can be seen that $Z_S$ has the following value.

$$Z_S = \frac{Z_A \times Z_{SS}}{Z_A + Z_{SS}} \quad (3)$$

where $$Z_{SS} = Z_P + Z_1 + \frac{Z_2 \times Z_3}{Z_2 + Z_3} \quad (4)$$

At the stopband frequencies in the present embodiment, $Z_A$ is much smaller than the impedances $Z_1$, $Z_2$, and $Z_3$ of the SAW resonators 12, 14, and 16, so the above equations (2) and (3) can be simplified as follows.

$$Z_O \cong \frac{Z_2 \times (Z_P + Z_1)}{Z_P + Z_1 + Z_2} + Z_3 \quad (5)$$

$$Z_S \cong Z_A \quad (6)$$

Since $Z_O$ is substantially independent of $Z_A$, and $Z_S$ is substantially equal to $Z_A$, a pole of attenuation can be produced at a desired stopband frequency by selecting $Z_A$ so that $Z_O$ is equal to $Z_S$ at this frequency. Moreover, since $Z_O$ depends on $Z_P$, and $Z_S$ is substantially independent of $Z_P$, the value of $Z_P$ can be selected to adjust $Z_O$ without strongly affecting $Z_S$. The range of frequencies over which impedance matching between $Z_O$ and $Z_S$ is achieved can be extended in this way.

Adjustment of $Z_P$ also increases the range of frequencies over which impedance matching between the SAW filter and external circuits is achieved.

Figure 6:
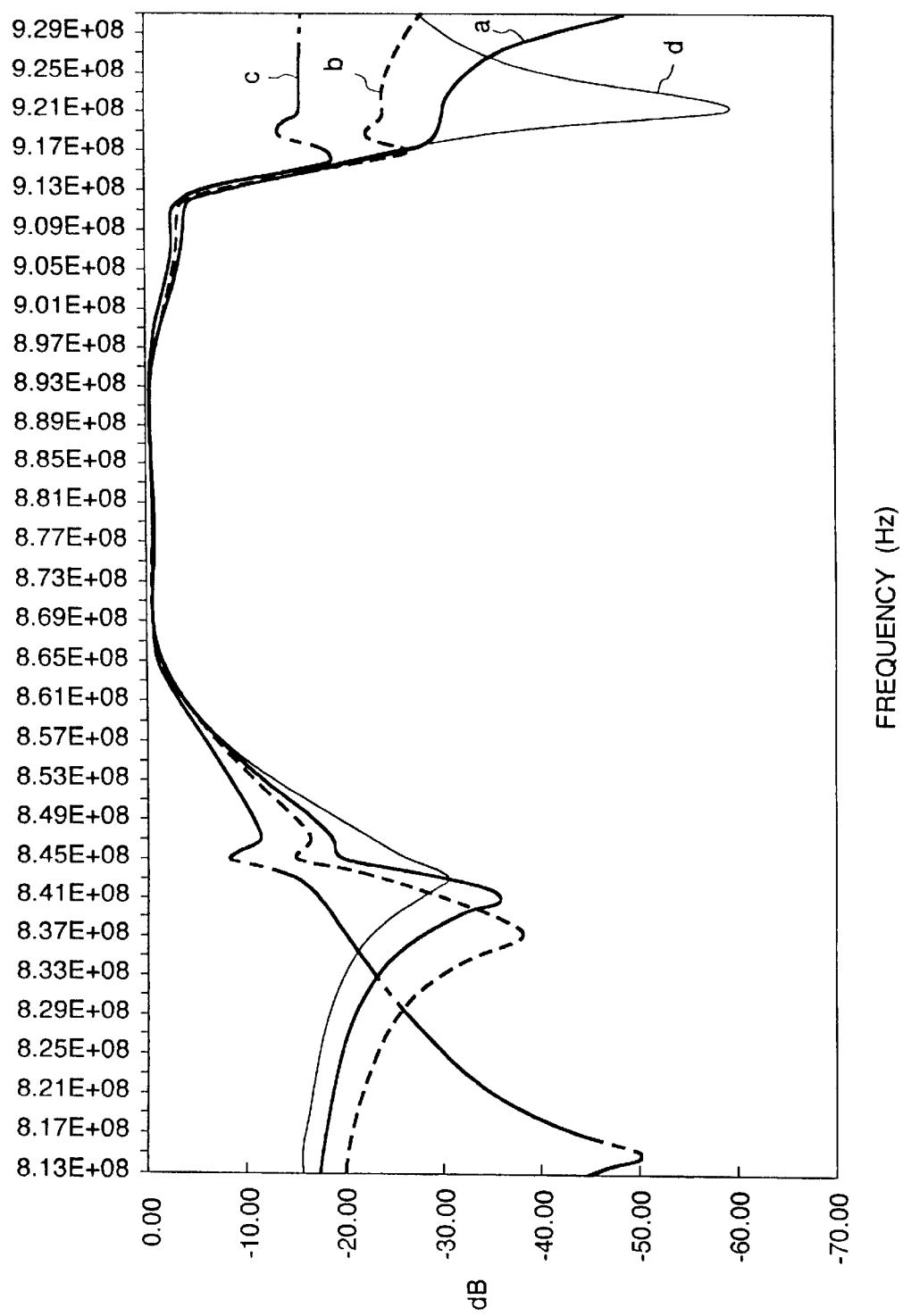
FIG. 6 shows frequency characteristics of the first embodiment for various capacitance values.

FIG. 6 illustrates the effect of adjusting $Z_A$, more specifically, of adjusting the capacitance $C_0$ of the capacitor 20. The horizontal axis represents frequency; the vertical axis represents attenuation in decibels. The curve marked 'a' was obtained by numerical simulation with $C_0$ set to the value 0.1 pF used in the present embodiment. $C_0$ was set to 0.2 pF for curve 'b,' to 0.5 pF for curve 'c,' and to zero for curve 'd.' Curve 'd' corresponds to the case in which the impedance circuit comprising the inductor 18 and capacitor 20 is not present.

These variations in $C_0$ have only a minor effect on the passband from 864 MHz to 894 MHz, but have a major effect on the upper and lower stopbands. A comparison of curves 'a' and 'd' shows that in both stopbands, the first embodiment widens the range of frequencies over which a given attenuation is attained.

SECOND EMBODIMENT

Figure 7:
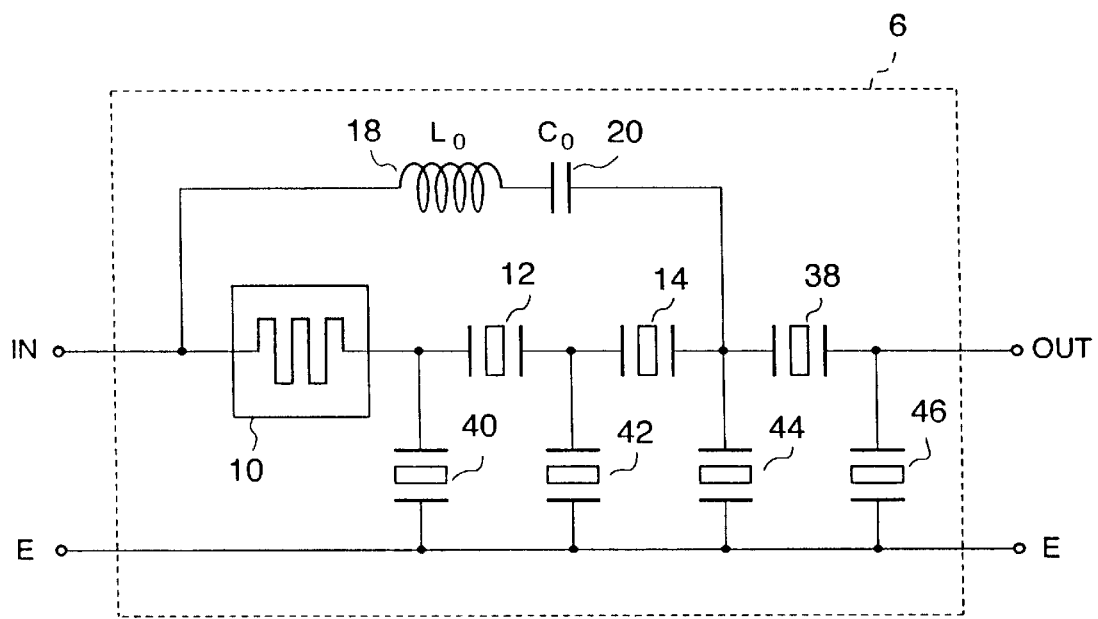
FIG. 7 is a schematic diagram of a second embodiment, also suitable for use as the receiving SAW filter in FIG. 1.

To improve the stopband attenuation characteristics, further SAW resonators can be added as shown in FIG. 7. As in the first embodiment, the impedance circuit comprises an inductor 18 with an impedance $L_0$ of 3.0 nH, and a capacitor 20 with a capacitance $C_0$ of 0.1 pF. The phase shifter 10 is again an 11-cm stripline. Each of the series-arm SAW resonators 12, 14, and 38 comprises an interdigital transducer with one hundred pairs of electrode fingers and an aperture of 50 µm. As in the first embodiment, the inductor 18 and capacitor 20 are coupled in parallel with the phase shifter 10 and the first pair of series-arm SAW resonators 12 and 14.

The second embodiment has four shunt-arm SAW resonators 40, 42, 44, and 46, which are coupled in a ladder configuration with the series-arm SAW resonators. The first and last shunt-arm SAW resonators 40 and 46 each have an interdigital transducer with sixty pairs of electrode fingers and an aperture of 60 µm. The two inner shunt-arm SAW resonators each have an interdigital transducer with eighty-five pairs of electrode fingers and an aperture of 85 µm.

Incidentally, it is possible to couple the impedance circuit, comprising the inductor 18 and capacitor 20, in parallel with all three series-arm SAW resonators 12, 14, and 38, but the inventors have found that better characteristics are obtained when the impedance circuit is coupled in parallel with just two series-arm SAW resonators.

Figure 8:
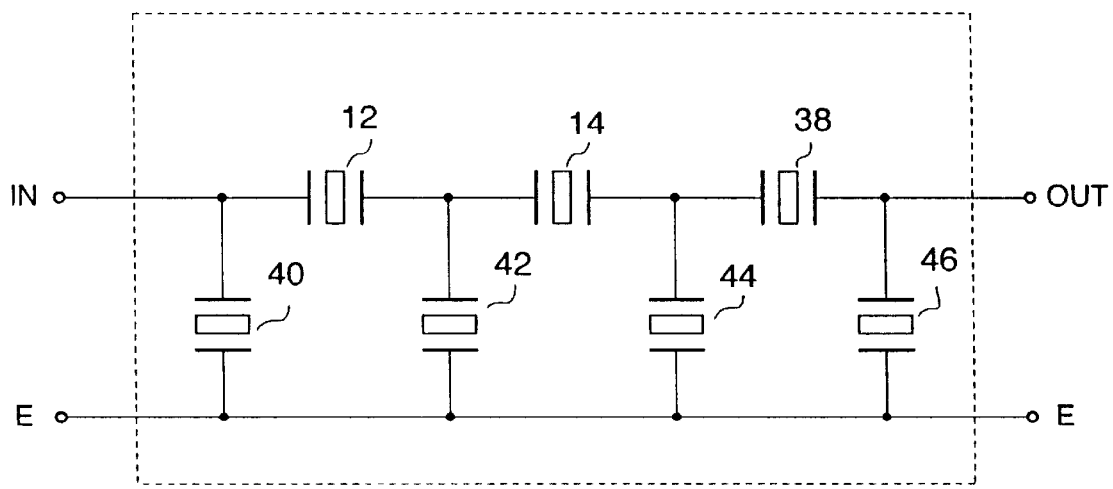
FIG. 8 is a schematic diagram of a conventional filter having the same SAW resonators as in FIG. 7.
Figure 9:
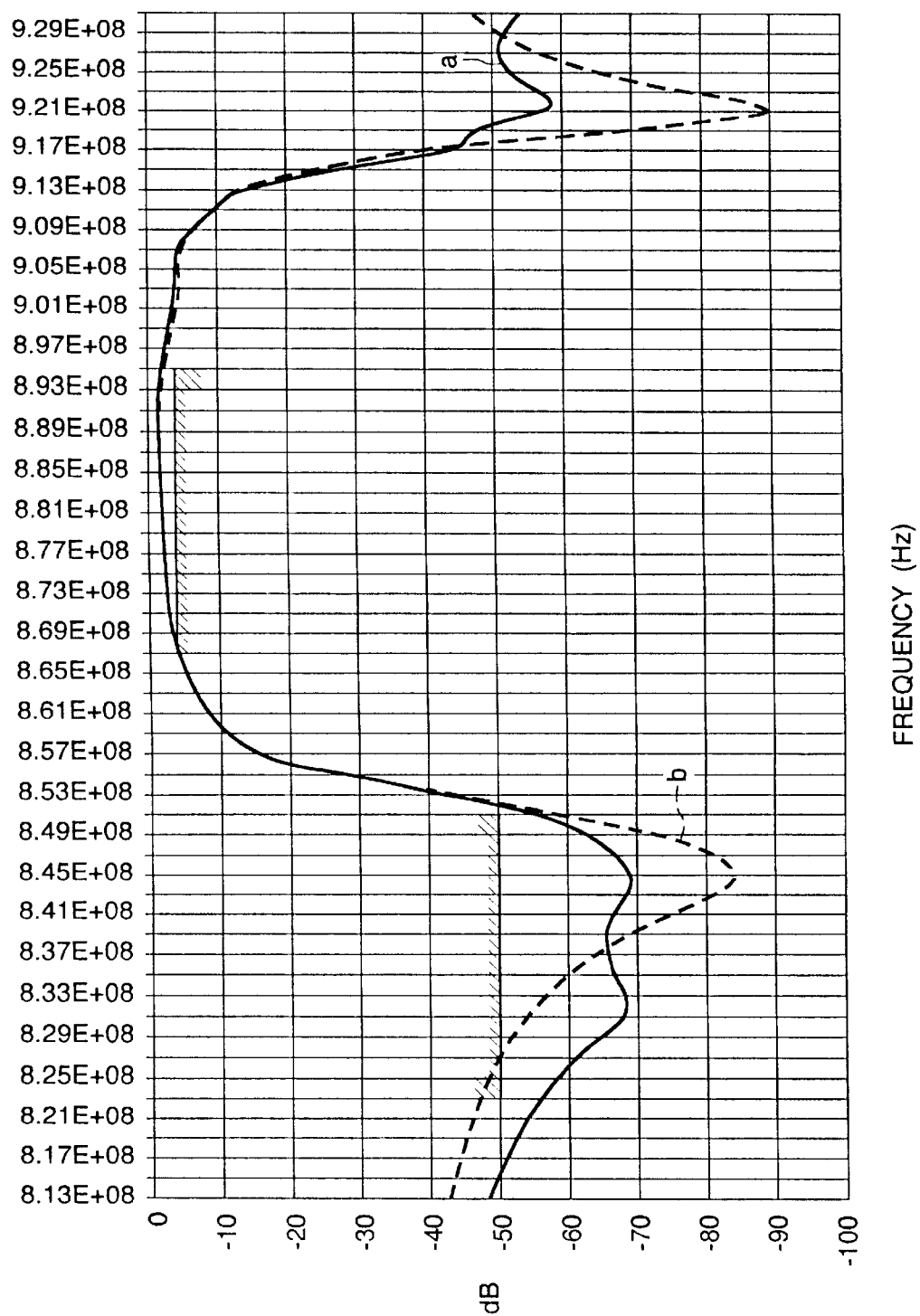
FIG. 9 compares the frequency characteristics of the filters in FIGS. 7 and 8.

FIG. 8 shows a conventional SAW ladder filter obtained by removing the phase shifter 10, inductor 18, and capacitor 20 from the second embodiment. FIG. 9 compares the frequency characteristic, marked 'a,' of the second embodiment with the frequency characteristic, marked 'b,' of this conventional SAW ladder filter. Both filters have substantially identical characteristics in the passband from 864 MHz to 894 MHz, with an insertion loss of less than four decibels (4 dB). In the lower stopband, however, the second embodiment satisfies the requirement of an attenuation of at least 50 dB over the full range from 824 MHz to 851 MHz, while the conventional SAW ladder filter does not.

A similar improvement can also be seen in the upper stopband.

THIRD EMBODIMENT

Figure 10:
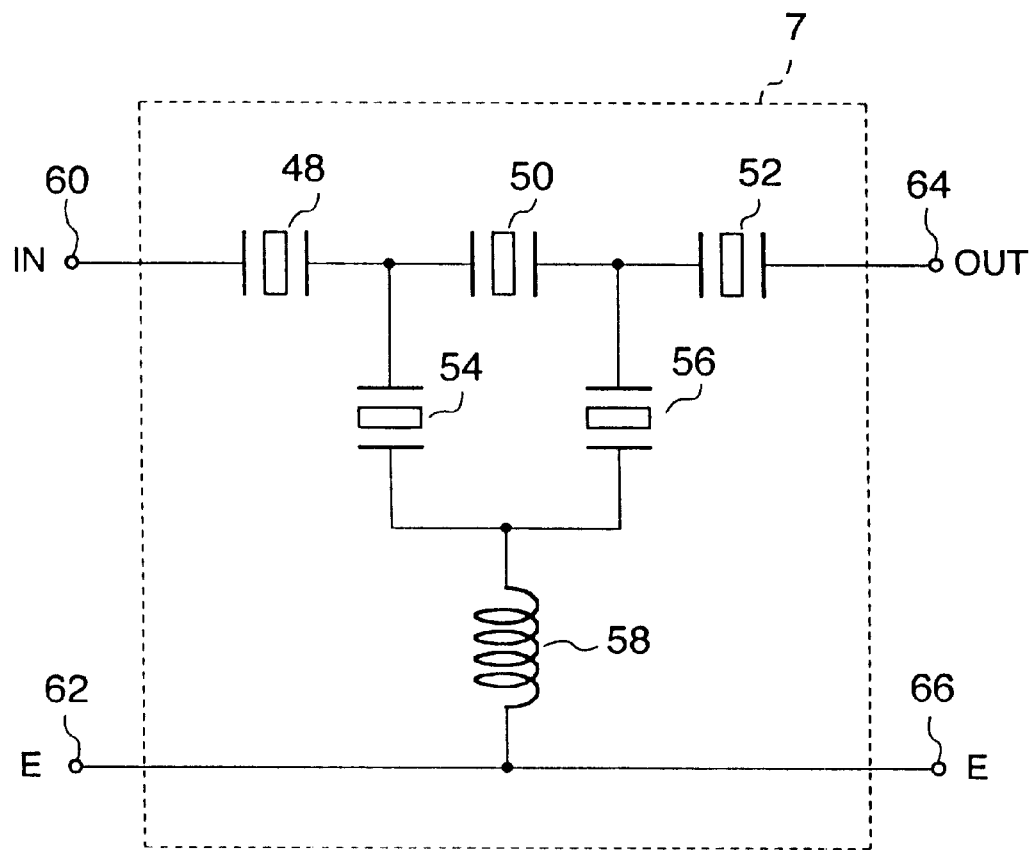
FIG. 10 is a schematic diagram of a third embodiment, suitable for use as the transmitting SAW filter in FIG. 1.

The third embodiment is a SAW filter suitable for use as the transmitting SAW filter 7 in FIG. 1. Referring to FIG. 10, this embodiment of the transmitting SAW filter 7 comprises three series-arm SAW resonators 48, 50, and 52, two shunt-arm SAW resonators 54 and 56, and an inductor 58. These elements form a two-port circuit with an input terminal 60 and ground terminal 62 on the input side, and an output terminal 64 and ground terminal 66 on the output side.

Each of the series-arm SAW resonators 48, 50, and 52 comprises an interdigital transducer with one hundred twenty pairs of electrode fingers and an aperture of 120 µm. Each of the shunt-arm SAW resonators 54 and 56 comprises an interdigital transducer with sixty pairs of electrode fingers and an aperture of 90 µm. The inductor 58 has an inductance of 4.0 nH.

Figure 11:
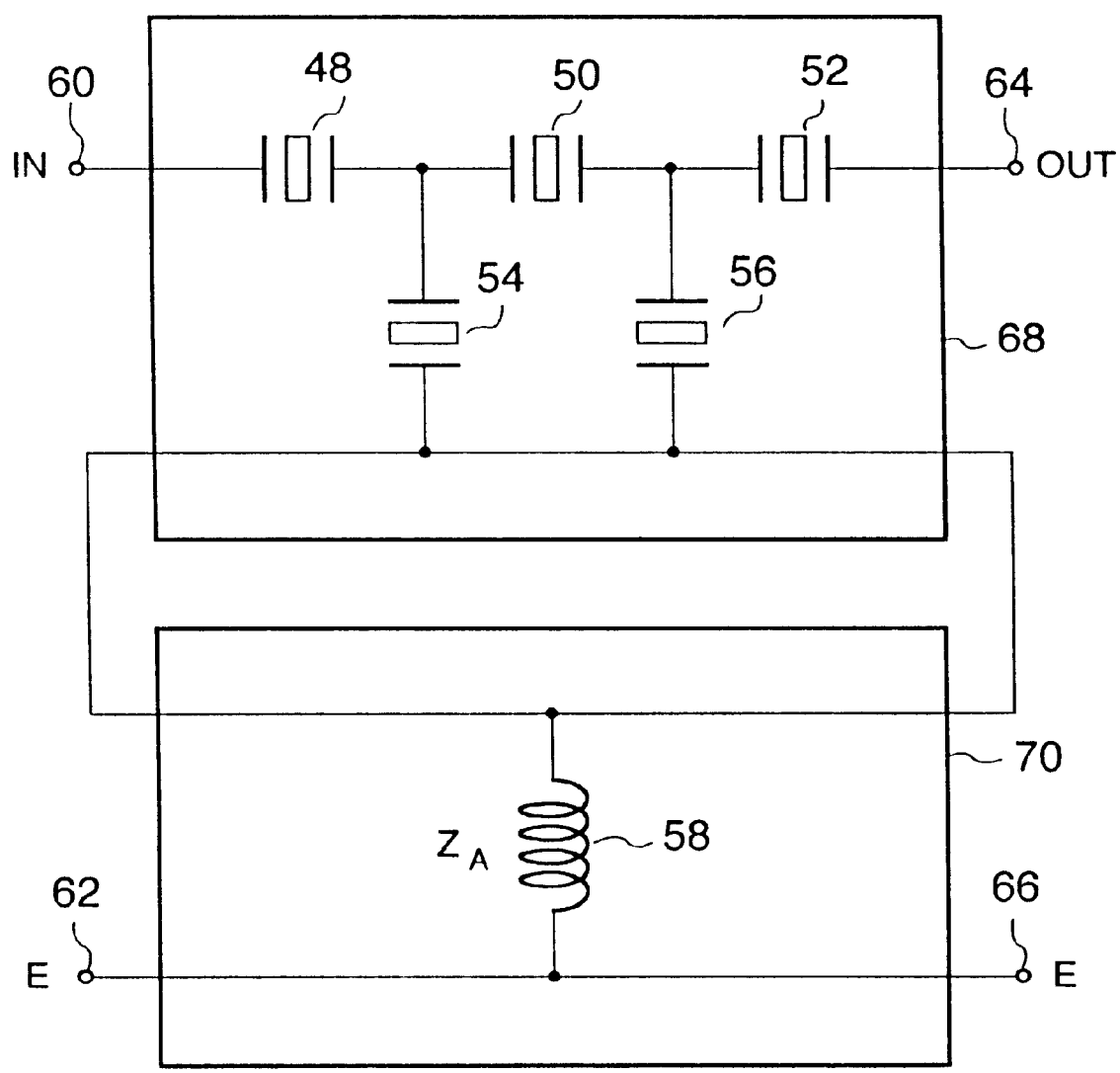
FIG. 11 shows FIG. 10 redrawn as a pair of two-port circuits coupled in series.

Referring to FIG. 11, this filter circuit can be represented as a pair of two-port circuits coupled in series. One two-port circuit 68 is a SAW filter comprising the SAW resonators 48, 50, 52, 54, and 56. The other two-port circuit 70 is an impedance circuit comprising the inductor 58, providing an impedance $Z_A$. The series coupling of these two-port circuits 68 and 70 means that their impedance matrices combine additively.

Figure 12:
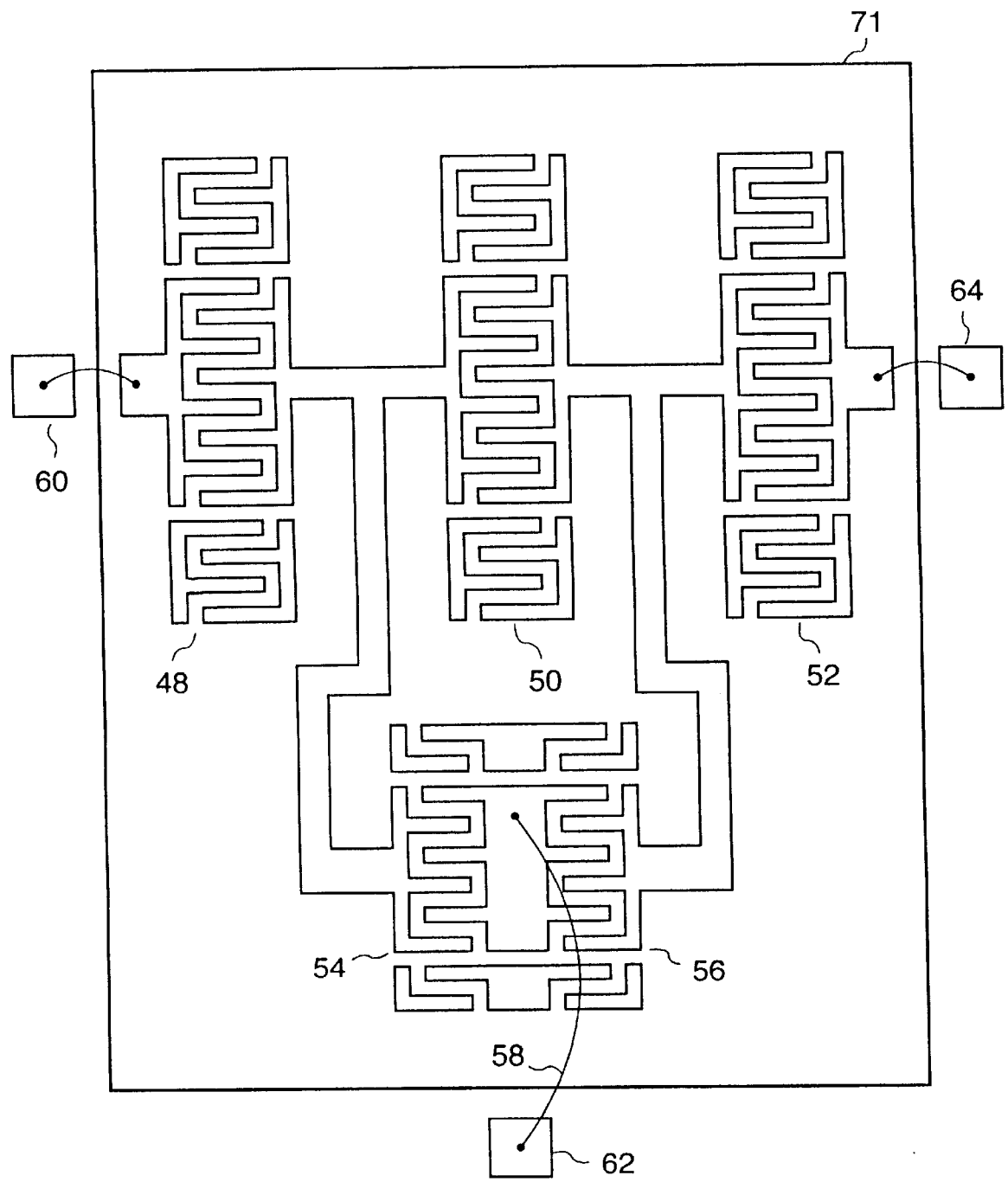
FIG. 12 is a simplified drawing of the interdigital transducer patterns in the third embodiment, illustrating the use of a bonding wire as the impedance circuit.

Referring to FIG. 12, the SAW resonators 48, 50, 52, 54, and 56 in the third embodiment are formed as metal-foil interdigital transducer patterns on a piezoelectric substrate 71. The two shunt-arm SAW resonators 54 and 56 are disposed back-to-back, sharing a common central electrode pattern. The inductor 58 is a length of bonding wire that couples this common electrode pattern to an external ground bonding pad 62. This bonding pad 62 combines the functions of the ground terminals 62 and 66 in FIG. 10. The inductance of the bonding-wire inductor 58 is determined by the point of attachment of the bonding-wire inductor 58 to the SAW resonators 54 and 56.

The number of electrode fingers of the interdigital transducers in FIG. 12 has been greatly reduced, to simplify the drawing.

Next, the operation of the third embodiment will be described.

Figure 13:
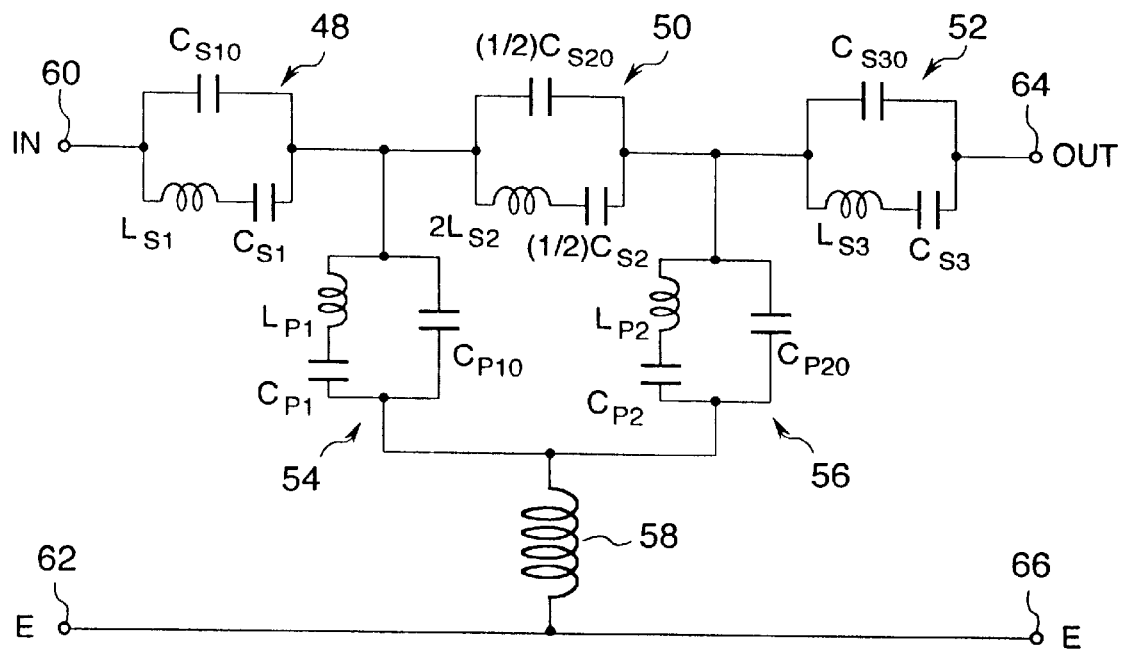
FIG. 13 shows equivalent circuit representations of the SAW resonators in FIG. 10.

FIG. 13 shows the SAW resonators 48, 50, 52, 54, and 56 represented by equivalent lumped-constant circuits. Series-arm SAW resonator 48 is represented by an inductance $L_{S1}$ and a capacitance $C_{S1}$ coupled in series, paralleled by a capacitance $C_{S10}$. Shunt-arm SAW resonator 54 is represented by an inductance $L_{P1}$ and a capacitance $C_{P1}$ coupled in series, paralleled by a capacitance $C_{P10}$. The central series-arm SAW resonator 50 is represented by an inductance of $2L_{S2}$ and a capacitance of $(\frac{1}{2})C_{S2}$ coupled in series, paralleled by a capacitance of $(\frac{1}{2})C_{S20}$.

Figure 14:
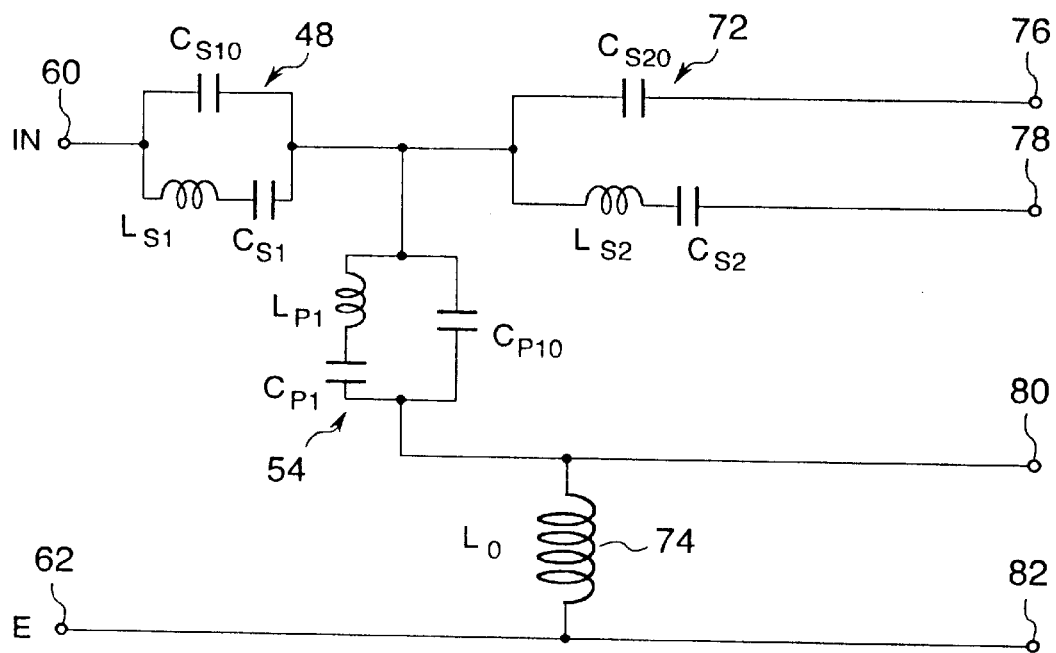
FIG. 14 illustrates the left half of FIG. 13.

This circuit is symmetrical, and can be analyzed by considering only the left half, as shown in FIG. 14. The central series-arm SAW resonator 50 in FIG. 13, when divided in half, yields the equivalent circuit 72 shown in FIG. 14, comprising an inductance $L_{S2}$ and a capacitance $C_{S2}$ coupled in series, paralleled by a capacitance $C_{S20}$, these circuit elements being coupled to a pair of terminals 76 and 78. Similarly, the inductor 58 in FIG. 12 becomes an inductor 74 with inductance $L_0$ in FIG. 14, coupled between a pair of terminals 80 and 82.

The impedance $Z_O$ between terminals 60 and 62 in FIG. 14 when terminals 76, 78, 80, and 82 are left open, and the impedance $Z_S$ when these terminals are short-circuited, are related to $L_0$ and the impedances $Z_1$, $Z_2$, and $Z_3$ of resonators 48, 72, and 54 by the following equations (7) and (8), in which S is equal to $j\omega$, $\omega$ being the angular frequency of the input signal.

$$Z_O = Z_1 + Z_3 + SL_0 \quad (7)$$

$$Z_S = Z_1 + \frac{Z_2 \times Z_3}{Z_2 + Z_3} \quad (8)$$

The values of $Z_1$, $Z_2$, and $Z_3$ are given by the following equations (9), (10), and (11).

$$Z_1 = (1 + S^2 L_{S1} C_{S1})/(SC_{S10} + SC_{S1} + S^3 L_{S1} C_{S1} C_{S10}) \quad (9)$$

$$Z_2 = (1 + S^2 L_{S2} C_{S2})/(SC_{S20} + SC_{S2} + S^3 L_{S2} C_{S2} C_{S20}) \quad (10)$$

$$Z_3 = (1 + S^2 L_{P1} C_{P1})/(SC_{P10} + SC_{P1} + S^3 L_{P1} C_{P1} C_{P10}) \quad (11)$$

The inductance $L_0$ does not appear in the equation (8) for $Z_S$, because $L_0$ is short-circuited by the connection of terminal 80 to terminal 82.

The frequency characteristic of the circuit in FIG. 14 is given by the same equation (1) as in the first embodiment. As in the first embodiment, a pole of attenuation can be produced by making $Z_O$ equal to $Z_S$, and this can be done by suitable selection of the inductance $L_0$, since $Z_O$ depends on $L_0$, while $Z_S$ does not.

The condition for equality between $Z_O$ and $Z_S$ is given by the following equation (12).

$$SL_0 = \frac{-Z_3^2}{Z_2 + Z_3} \quad (12)$$

The third embodiment is designed so that this condition is satisfied over a wide range of high frequencies, as will be illustrated below.

Figure 15:
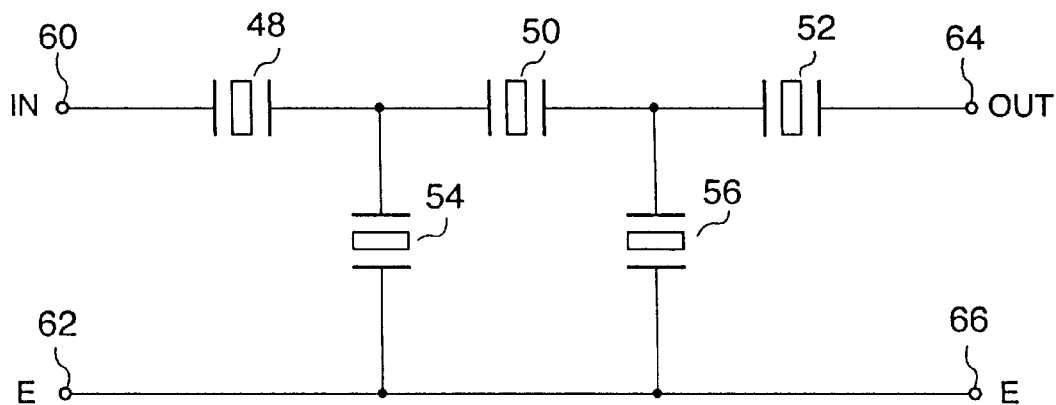
FIG. 15 illustrates a conventional filter not having an impedance circuit.
Figure 16:
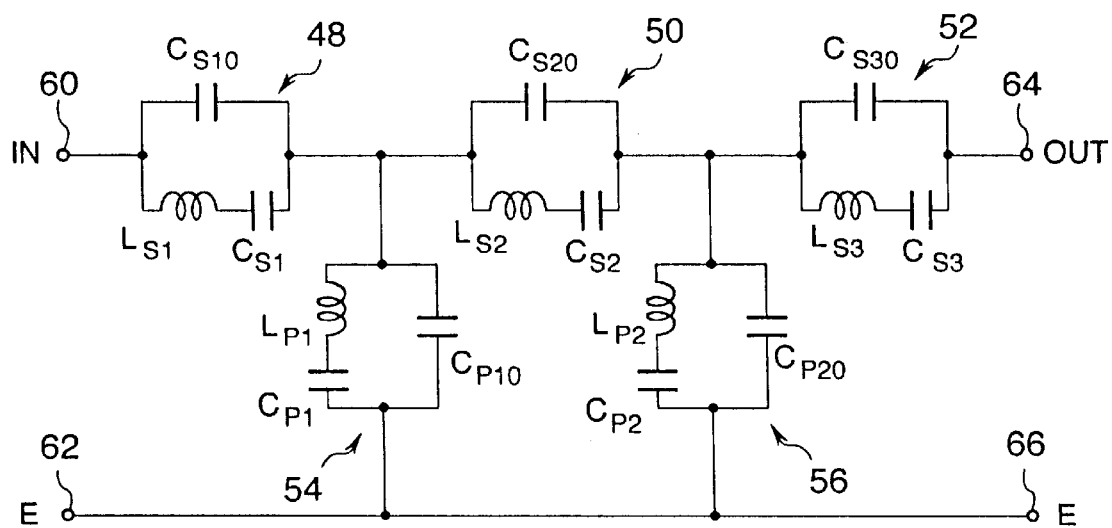
FIG. 16 shows equivalent circuit representations of the SAW resonators in FIG. 15.

For comparison, FIG. 15 shows a conventional SAW filter lacking the inductor 58 of the third embodiment. FIG. 16 shows the corresponding equivalent lumped-constant circuit representation. The circuit constants in FIG. 16 are the same as the corresponding constants in FIG. 13.

Figure 17:
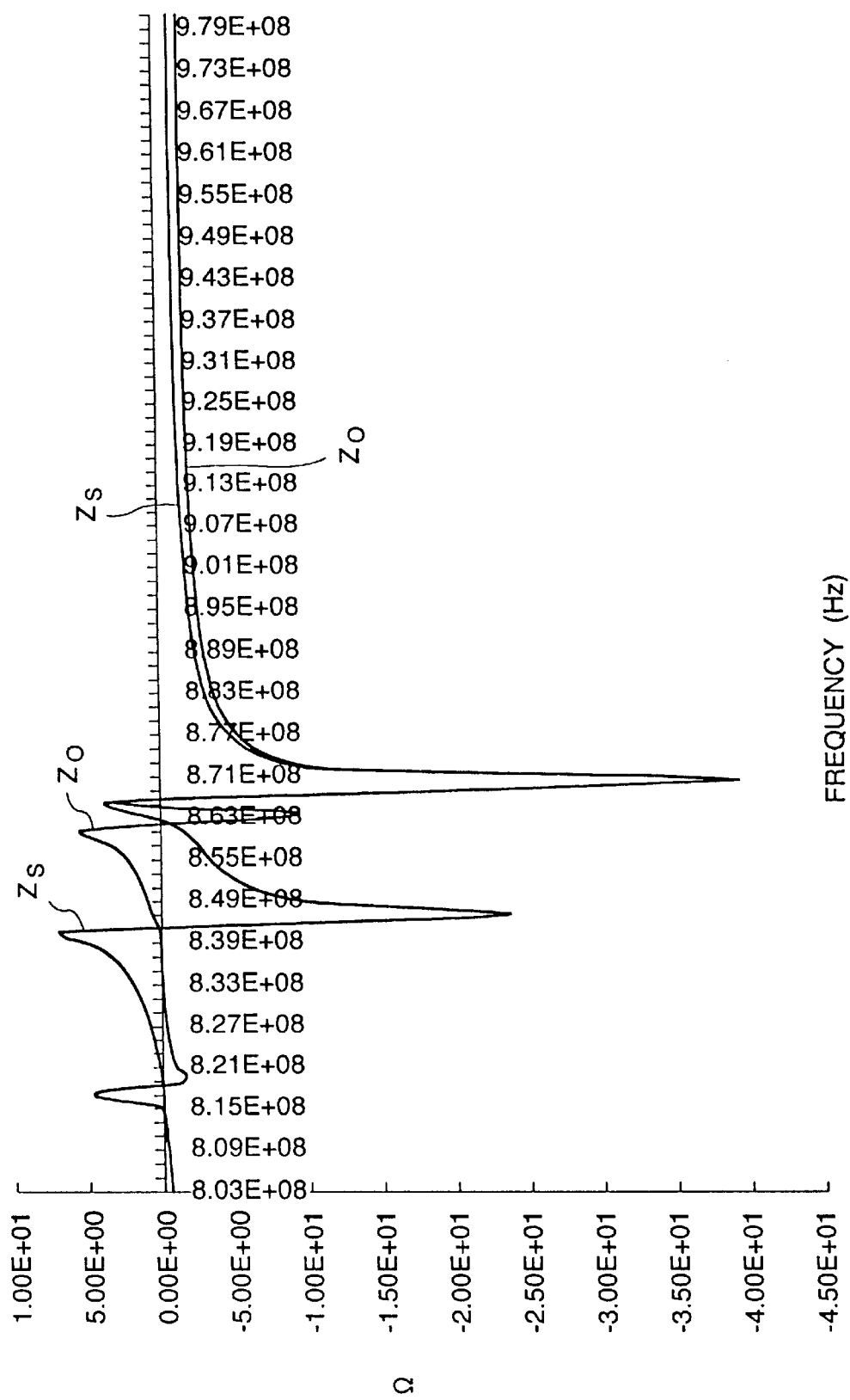
FIG. 17 shows open-circuited and short-circuited frequency characteristics for the conventional filter in FIG. 15.

Graphs of the open-circuited impedance $Z_O$ and short-circuited impedance $Z_S$ of this conventional SAW filter are shown in FIG. 17. The horizontal axis indicates frequency in hertz (Hz); the vertical axis indicates impedance in ohms ($\Omega$). $Z_O$ and $Z_S$ were calculated from equations (7) to (11) with $L_0$ set equal to zero. The difference between $Z_O$ and $Z_S$ in the frequencies above about 875 MHz should be noted, as these frequencies are located in the desired upper stopband of the filter.

Figure 18:
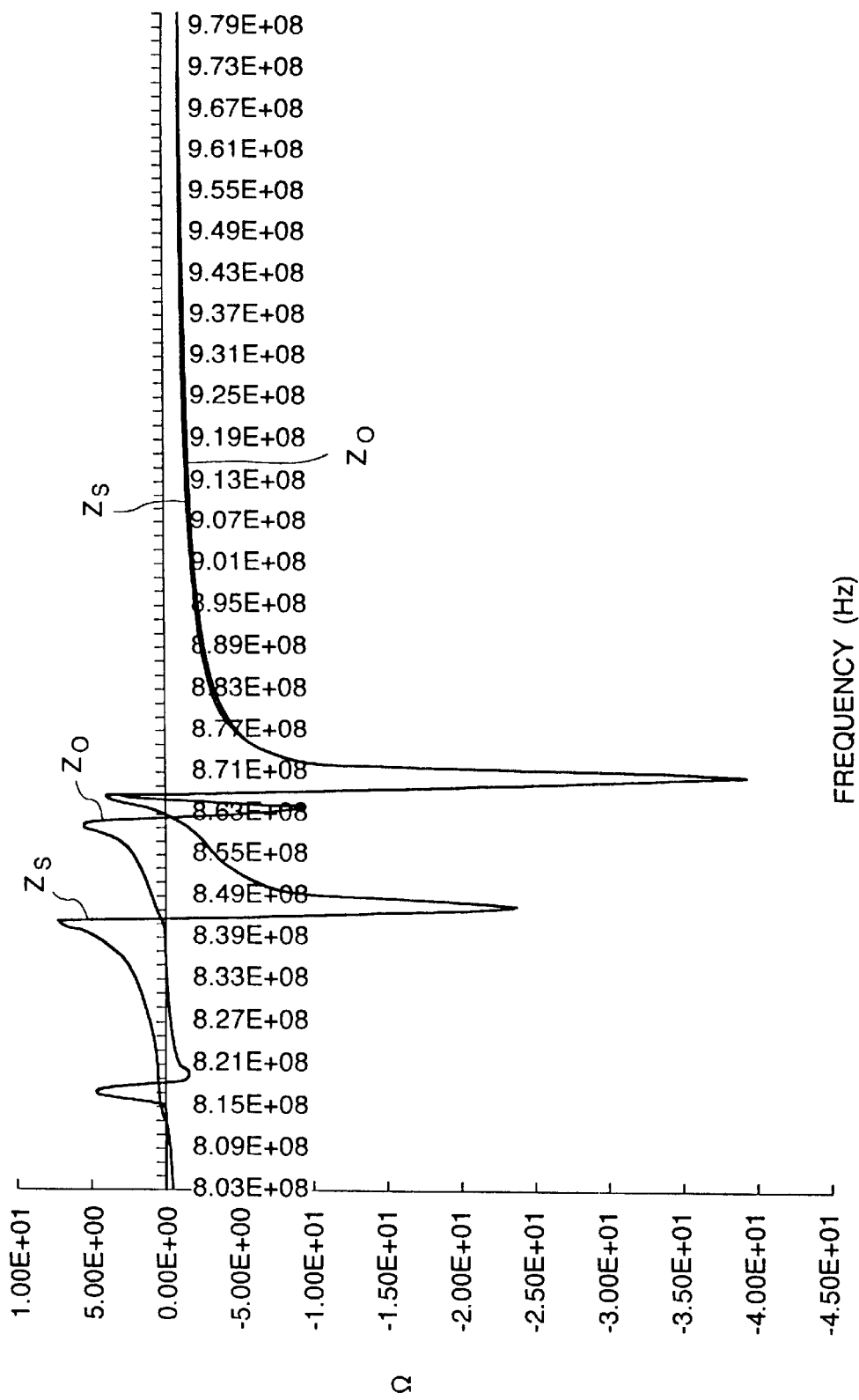
FIG. 18 shows open-circuited and short-circuited frequency characteristics for the third embodiment.

FIG. 18 shows the open-circuited impedance $Z_O$ and short-circuited impedance $Z_S$ of the third embodiment, calculated from the same equations (7) to (11), with $L_0$ set equal to 4.0 nH. The horizontal and vertical axes have the same meaning as in FIG. 17. Compared with FIG. 17, the difference between $Z_O$ and $Z_S$ in the upper stopband is greatly reduced.

Figure 19:
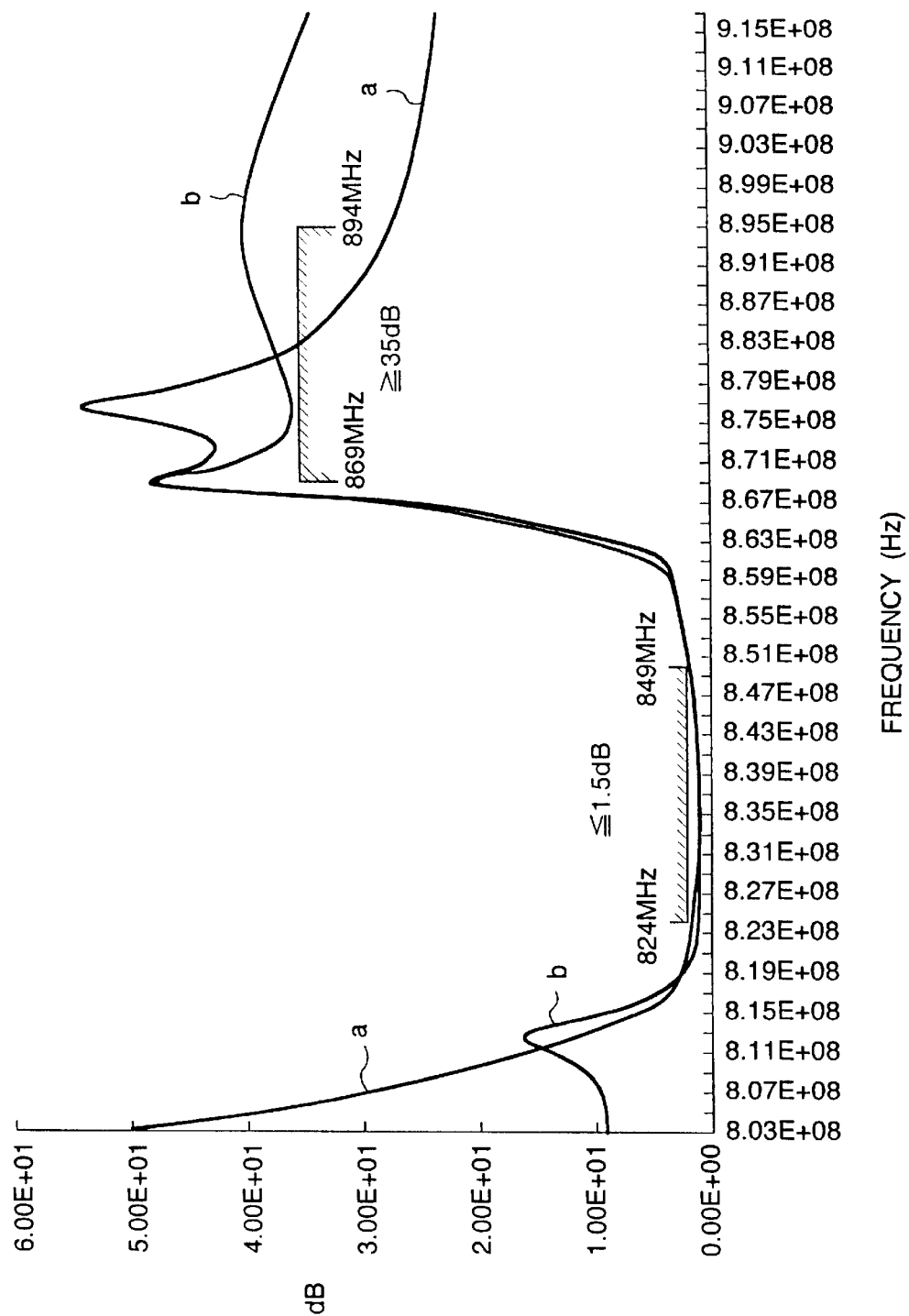
FIG. 19 compares frequency characteristics of the filter in FIG. 15 and the third embodiment.

FIG. 19 compares the frequency characteristic, marked 'a,' of the conventional filter in FIG. 15 with the frequency characteristic, marked 'b,' of third embodiment. The horizontal axis indicates frequency in hertz, while the vertical axis indicates attenuation in decibels. In the passband, both filters satisfy the requirement of an insertion loss not exceeding 1.5 dB at all frequencies from 824 MHz to 849 MHz. In the upper stopband, the third embodiment also satisfies the requirement for an attenuation of at least 35 dB at all frequencies from 869 MHz to 894 MHz, but the conventional filter does not.

FIG. 20 summarizes the information in FIGS. 17 to 19 in the form of a table.

The right part of FIG. 20 gives values of the open-circuited impedance $Z_O$ and short-circuited impedance $Z_S$ at three frequencies near the high end of the upper stopband (889 MHz, 895 MHz, and 901 MHz). When $L_0$ is zero, the difference between $Z_O$ and $Z_S$ is $-j0.72$ or greater. When $L_0$ is 4.0 nH, the difference between $Z_O$ and $Z_S$ is reduced to $-j0.30$ or less.

The left part of FIG. 20 gives impedance values at the two ends of the passband (823 MHz and 849 MHz) and the two ends of the upper stopband (869 MHz and 895 MHz). At the high end of the upper stopband (895 MHz), the attenuation of the third embodiment ($L_0$=4.0 nH) exceeds the attenuation of the conventional filter ($L_0$=0 nH) by about thirteen decibels, a substantial improvement.

Figure 21:
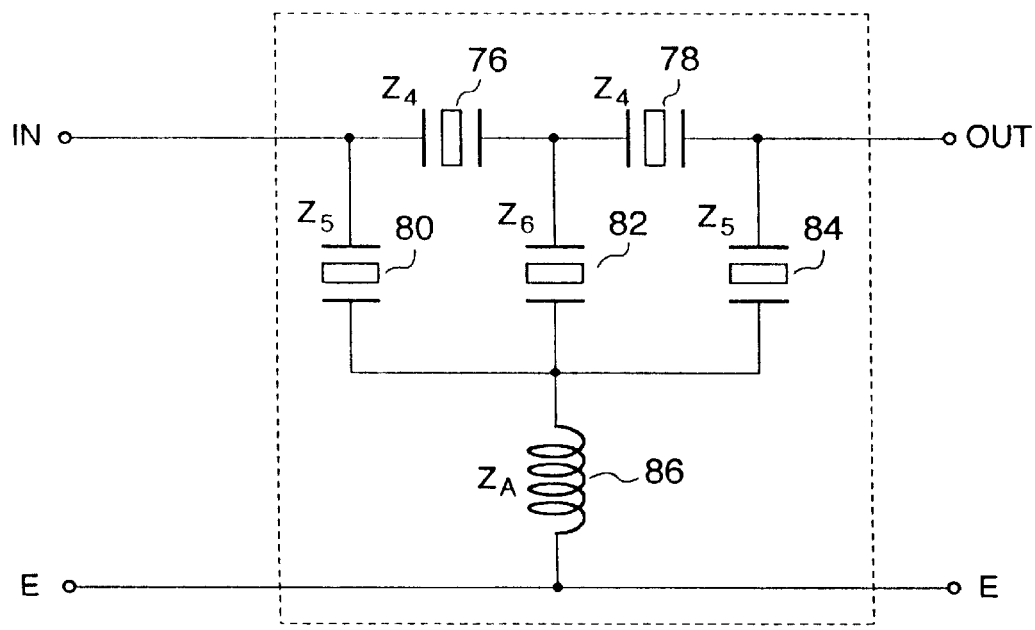
FIG. 21 is a schematic diagram of a four-stage filter having three shunt-arm SAW resonators and a single inductor.

For further comparison with the third embodiment, FIG. 21 shows a four-stage SAW filter comprising two series-arm SAW resonators 76 and 78, three shunt-arm SAW resonators 80, 82, and 84, and a single inductor 86. The inductor 86 is coupled between the ground line E—E and all three shunt-arm SAW resonators 80, 82, and 84.

If this circuit is analyzed in the same way as the third embodiment was analyzed, writing $Z_4$ for the impedance of each of the series-arm SAW resonators 76 and 78, $Z_5$ for the impedance of the two outer shunt-arm SAW resonators 80 and 84, $Z_6$ for the impedance of the central shunt-arm SAW resonator 82, and $Z_A$ for the impedance furnished by the inductor 86, the total open-circuit impedance $Z_O$ and total short-circuit impedance $Z_S$ are given by the following equations (13) and (14).

$$Z_O = \frac{Z_5 \times (Z_4 + Z_6)}{Z_5 + Z_4 + Z_6} + Z_A \quad (13)$$

$$Z_S = \frac{Z_4 \times Z_5}{Z_4 + Z_5} \quad (14)$$

As in the third embodiment, $Z_O$ can be made equal to $Z_S$ at a given frequency by suitable selection of $Z_A$. A major improvement in the frequency characteristic of the filter cannot be expected, however, because the condition for equality of $Z_O$ and $Z_S$ is now given by the following equation (15).

$$Z_A = \frac{-Z_5^2 Z_6}{(Z_4+Z_5)(Z_4+Z_5+Z_6)} \quad (15)$$

This condition is more complex than the condition given by equation (12). It is not easy to design a filter with the configuration in FIG. 21 so that equation (15) is satisfied over a wide range of frequencies.

Figure 22:
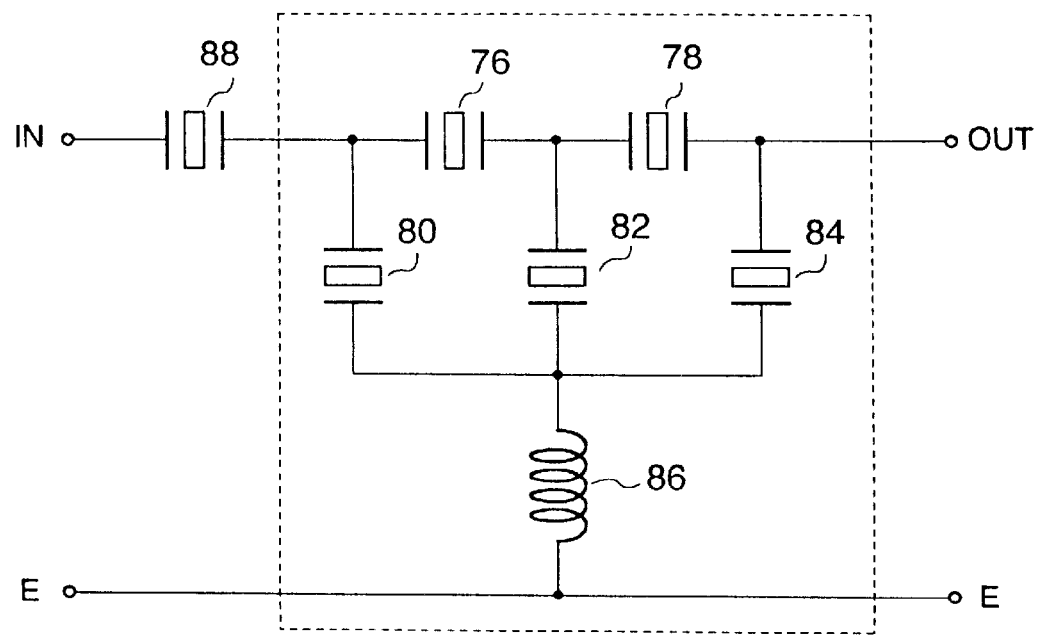
FIG. 22 is a schematic diagram of a five-stage filter having three shunt-arm SAW resonators and a single inductor.

A consequence is that when further SAW resonators are added to the filter to achieve greater stopband attenuation, the filter design should be based on the model in FIG. 11 rather than the model in FIG. 21. FIG. 22, for example, shows a non-preferred five-stage SAW filter obtained by adding one more SAW resonator 88 to the series arm in FIG. 21. The part enclosed in the dotted line in FIG. 22 is the same as in FIG. 21. The equations above indicate that less improvement can be expected in this filter design than in a design based on FIG. 11, which will be illustrated in the fourth embodiment below.

FOURTH EMBODIMENT

Figure 23:
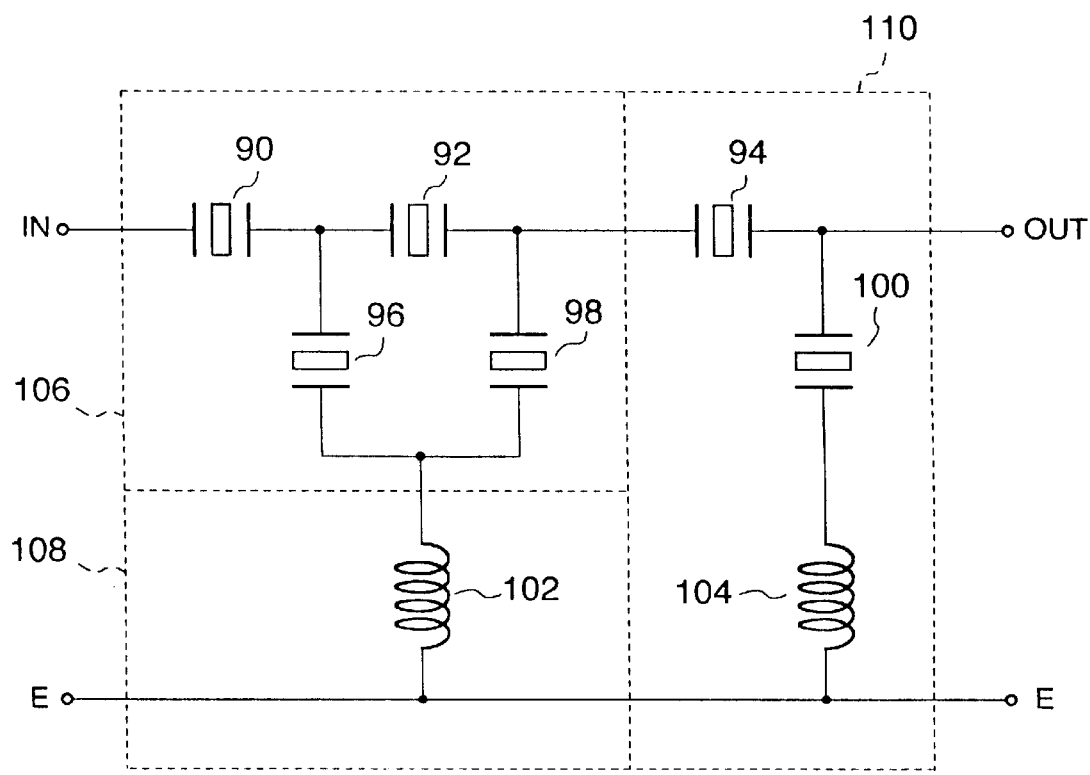
FIG. 23 is a schematic diagram of a fourth embodiment of the invention, also suitable for use as the transmitting SAW filter in FIG. 1.

Referring to FIG. 23, the fourth embodiment is a five-stage SAW filter comprising three series-arm SAW resonators 90, 92, and 94, three shunt-arm SAW resonators 96, 98, 100, and two inductors 102 and 104. Inductor 102 is a bonding wire coupled between the first two shunt-arm SAW resonators 96 and 98 and the ground line E—E. These two shunt-arm SAW resonators 96 and 98 are preferably disposed back-to-back, like the SAW resonators 54 and 56 in FIG. 12. Inductor 104 is a bonding wire coupled between the third shunt-arm SAW resonator 100 in FIG. 23 and the ground line.

Each of the series-arm SAW resonators 90, 92, and 94 has an interdigital transducer with one hundred pairs of electrode fingers and an aperture of 120 $\mu$m. Each of the shunt-arm SAW resonators 96, 98, and 100 has an interdigital transducer with eighty pairs of electrode fingers and an aperture of 90 $\mu$m. The inductance of the inductor 102 is 0.1 nH; the inductance of inductor 104 is also 0.1 nH.

This filter can be considered to consist of three sub-parts: a SAW filter circuit 106 comprising the first two series-arm SAW resonators 90 and 92 and the first two shunt-arm SAW resonators 96 and 98; an impedance circuit 108, comprising inductor 102, which is coupled in series with SAW filter circuit 106; and a SAW filter circuit 110 comprising the third series-arm SAW resonator 94, third shunt-arm SAW resonator 100, and inductor 104. SAW filter circuit 106 and impedance circuit 108 combine to form a filter section that is connected in cascade with SAW filter circuit 110. The two SAW filter circuits 106 and 110 combine to form a SAW ladder filter.

Figure 24:
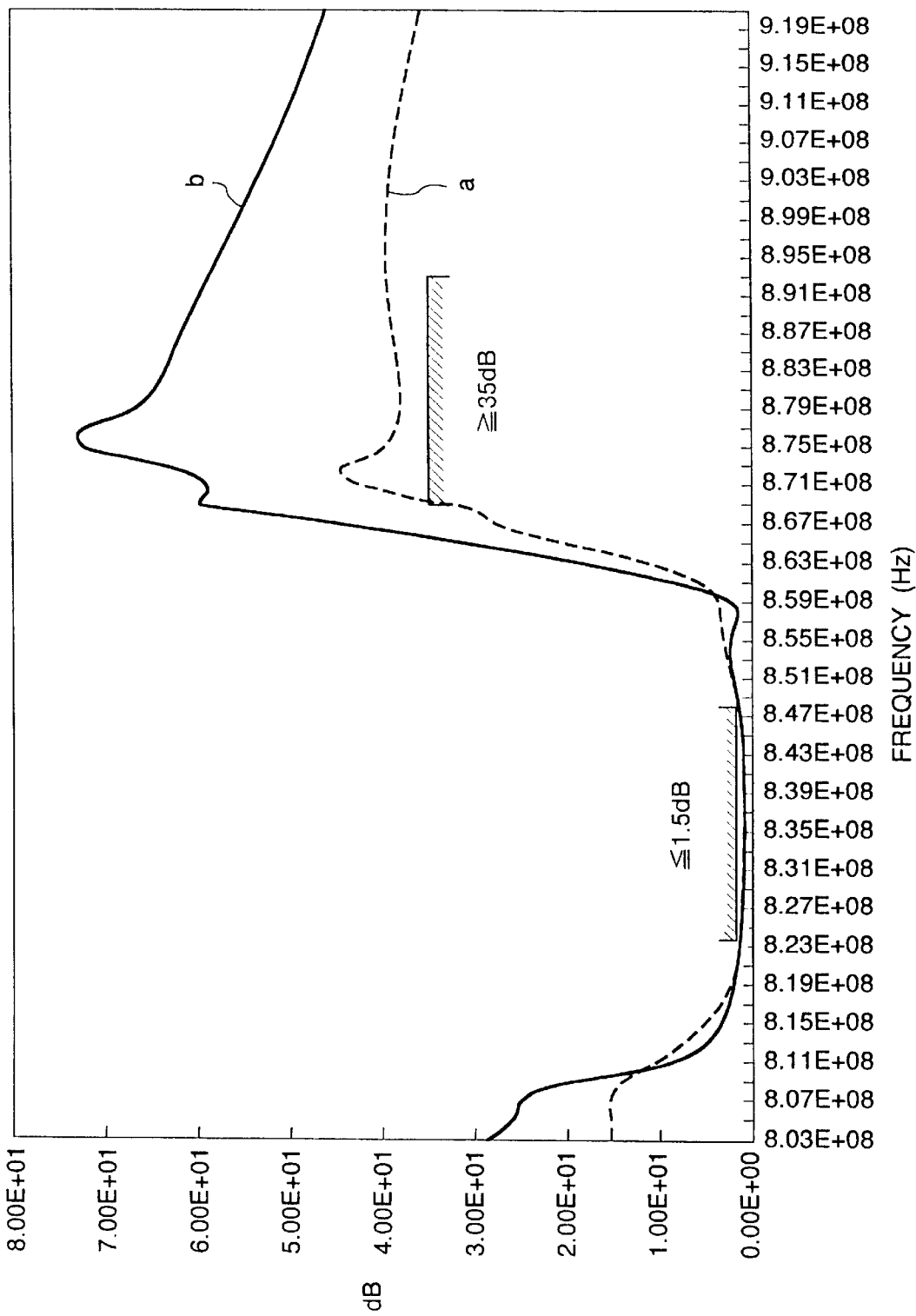
FIG. 24 compares frequency characteristics of the filters in FIGS. 22 and 23.

FIG. 24 compares the frequency characteristic, marked 'a,' of the non-preferred filter in FIG. 22 with the frequency characteristic, marked 'b,' of fourth embodiment. The inductor 86 in FIG. 22 is assumed to have the same 0.1-nH inductance as the inductors 102 and 104 in FIG. 23. Both filters meet the requirement for an insertion loss of 1.5 dB or less in the passband from 824 MHz to 849 MHz. The filter in FIG. 22, however, does not entirely meet the requirement for an attenuation of at least 35 dB in the stopband from 869 mHz to 894 MHz. The fourth embodiment has a steeper roll-off between the passband and stopband, and clears this 35-dB requirement by a wide margin, providing excellent stopband attenuation.

FIFTH EMBODIMENT

Figure 25:
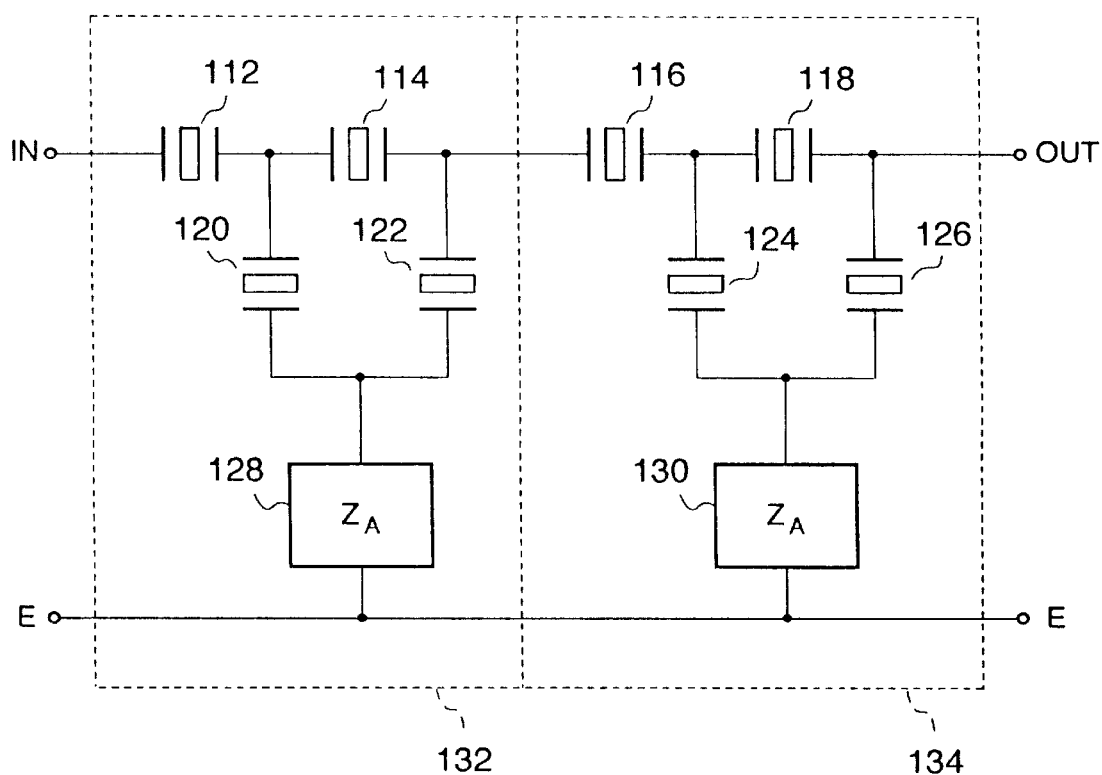
FIG. 25 is a schematic diagram of a fifth embodiment of the invention, also suitable for use as the transmitting SAW filter in FIG. 1.
Figure 26:
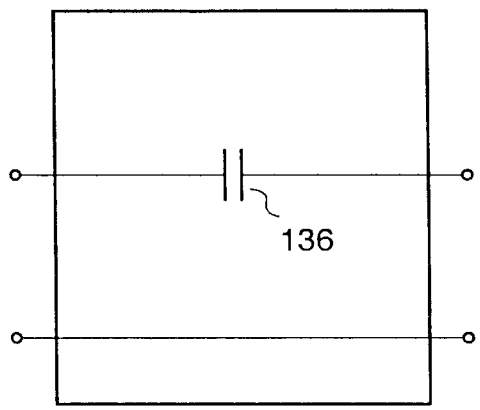
FIGS. 26, 27, 28, and 29 illustrate alternative configurations of the two-port impedance circuit in FIG. 3.
Figure 27:
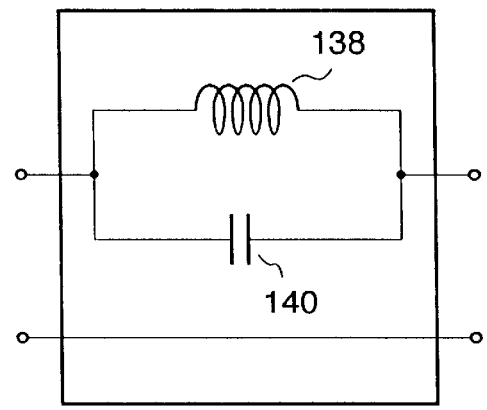
Figure 28:
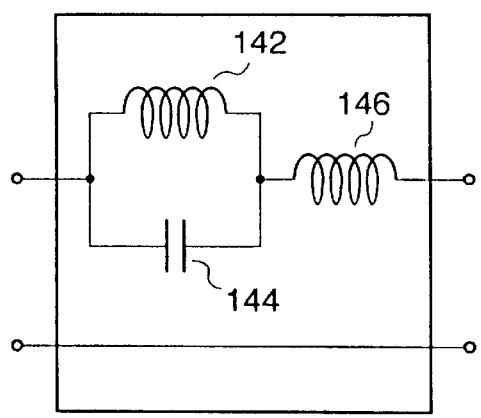
Figure 29:
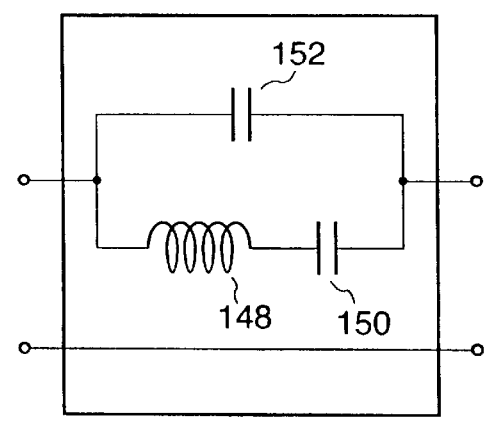
Figure 30:
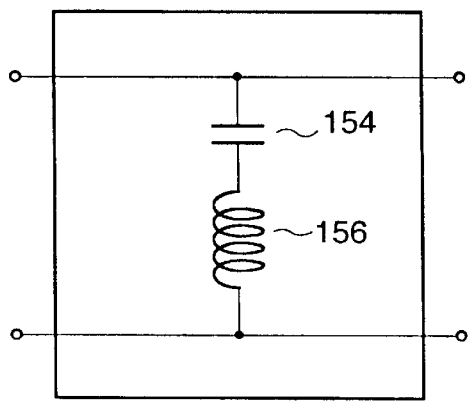
FIGS. 30, 31, 32, and 33 illustrate alternative configurations of the two-port impedance circuit in FIG. 11.
Figure 31:
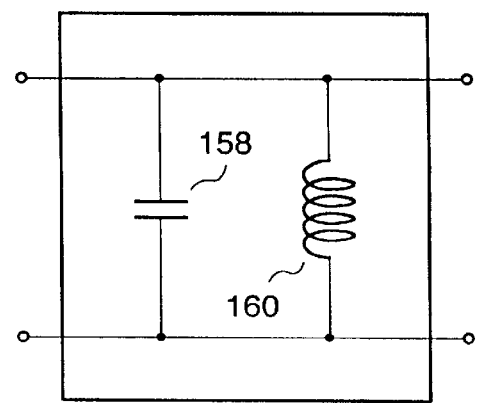
Figure 32:
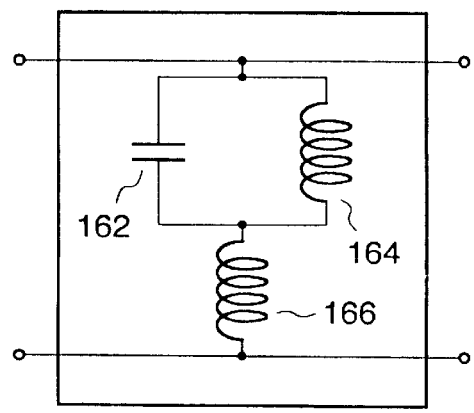
Figure 33:
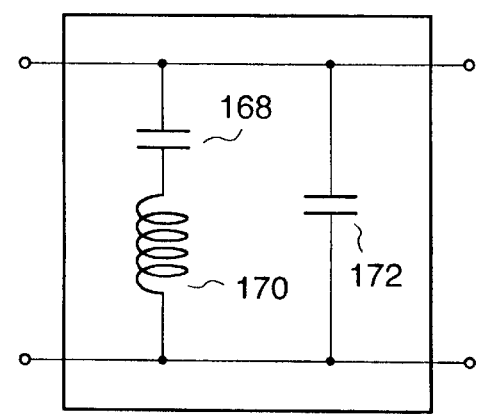

Referring to FIG. 25, a fifth embodiment of the invention extends the concept of the third and fourth embodiments to a six-stage SAW filter having four series-arm SAW resonators 112, 114, 116, and 118, four shunt-arm SAW resonators 120, 122, 124, and 126, and two inductors 128 and 130.

This filter can be divided into two sections 132 and 134, each similar in design to the section comprising the SAW filter circuit 106 and impedance circuit 108 in FIG. 23. The impedance $Z_A$ in each section can be selected to provide high attenuation across a wide range of stopband frequencies. The two filter sections 132 and 134 are cascaded, so that their ABCD transfer parameters combine by matrix multiplication.

Referring again to FIG. 10, the third embodiment can also be described as comprising a two-port SAW filter circuit with two series-arm SAW resonators 48 and 50 and two shunt-arm SAW resonators 54 and 56, coupled in series with a two-port impedance circuit comprising the inductor 58, these two circuits forming a first filter section, which is cascaded with a second filter section comprising SAW resonator 52.

The impedance circuits employed in the present invention are not limited to the circuits shown in the preceding embodiments.

In the first embodiment, for example, the impedance circuit 32 shown in FIG. 3 can be replaced with one of the impedance circuits shown in FIGS. 26, 27, 28, and 29. The circuit in FIG. 26 comprises a capacitor 136. The circuit in FIG. 27 comprises an inductor 138 and capacitor 140 coupled in parallel. The circuit in FIG. 28 comprises an inductor 142 and capacitor 144 coupled in parallel, both also coupled in series with an inductor 146. The circuit in FIG. 29 comprises an inductor 148 and capacitor 150 coupled in series, paralleled by a capacitor 152. Similar replacements are possible in the second embodiment.

In the third embodiment, the impedance circuit 70 shown in FIG. 11 can be replaced with one of the impedance circuits shown in FIGS. 30, 31, 32, and 33. The circuit in FIG. 30 comprises a capacitor 154 coupled in series with an inductor 156. The circuit in FIG. 31 comprises a capacitor 158 and an inductor 160 coupled in parallel. The circuit in FIG. 32 comprises a capacitor 162 and an inductor 164 coupled in parallel, both also coupled in series with an inductor 166. The circuit in FIG. 33 comprises a capacitor 168 and an inductor 170 coupled in series, paralleled by a capacitor 172. Similar replacements are possible in the fourth and fifth embodiments.

The phase shifter 10 in the first and second embodiments is not limited to a stripline formed on the same piezoelectric substrate as the SAW resonators. Referring again to FIG. 1, part or all of the phase shifter 10 may be disposed on the main substrate 9. For example, the phase shifter 10 may comprise both a stripline formed on the piezoelectric substrate 8 and a stripline formed on the main substrate 9, as part of the coupling circuit 5. It is advantageous to have at least part of the phase shifter 10 disposed on the main substrate 9, as modifications to the characteristics of the phase shifter are more easily made on the main substrate 9 than on the piezoelectric substrate 8.

Those skilled in the art will recognize that further variations are possible within the scope claimed below.

What is claimed is:

1. A surface-acoustic-wave filter with poles, comprising:
    a two-port surface-acoustic-wave resonator filter circuit having a phase shifter, at least one series-arm surfaceacoustic-wave resonator coupled in series with said phase shifter, and at least one shunt-arm surface-acoustic-wave resonator; and a two-port impedance circuit coupled in parallel with said two-port surface-acoustic-wave resonator filter circuit, having an impedance that creates a pole of attenuation by making an open-circuit impedance of said surface-acoustic-wave filter equal to a short-circuit impedance of said surface-acoustic-wave filter.

2. The surface-acoustic-wave filter of claim 1, wherein said two-port surface-acoustic-wave resonator filter circuit has just two series-arm surface-acoustic-wave resonators.

3. The surface-acoustic-wave filter of claim 1, wherein said two-port impedance circuit comprises a first capacitor.

4. The surface-acoustic-wave filter of claim 3, wherein said two-port impedance circuit also comprises a first inductor.

5. The surface-acoustic-wave filter of claim 4, wherein said first inductor comprises a bonding wire having a certain inductive impedance.

6. The surface-acoustic-wave filter of claim 4, wherein said first capacitor and said first inductor are coupled in series.

7. The surface-acoustic-wave filter of claim 6, wherein said two-port impedance circuit further comprises a second capacitor coupled in parallel with said first capacitor and said first inductor.

8. The surface-acoustic-wave filter of claim 4, wherein said first capacitor and said first inductor are coupled in parallel.

9. The surface-acoustic-wave filter of claim 8, wherein said two-port impedance circuit further comprises a second inductor coupled in series with said first capacitor and said first inductor.

10. The surface-acoustic-wave filter of claim 1, wherein said surface-acoustic-wave filter is disposed in an antenna duplexer, and said phase shifter comprises an interconnecting line in said antenna duplexer.

11. The surface-acoustic-wave filter of claim 1, wherein said at least one series-arm surface-acoustic-wave resonator, said at least one shunt-arm surface-acoustic-wave resonator, and said phase shifter are formed on a piezoelectric substrate.

12. The surface-acoustic-wave filter of claim 11, wherein said phase shifter comprises a stripline formed on said piezoelectric substrate.

13. The surface-acoustic-wave filter of claim 1, wherein said at least one series-arm surface-acoustic-wave resonator, and said at least one shunt-arm surface-acoustic-wave resonator are formed on a piezoelectric substrate, said piezoelectric substrate is mounted on a main substrate, and said phase shifter is formed on said main substrate.

14. The surface-acoustic-wave filter of claim 1, wherein said at least one series-arm surface-acoustic-wave resonator, and said at least one shunt-arm surface-acoustic-wave resonator are formed on a piezoelectric substrate, said piezoelectric substrate is mounted on a main substrate, and said phase shifter is formed partly on said piezoelectric substrate and partly on said main substrate.

15. A surface-acoustic-wave filter with poles, comprising:

a two-port surface-acoustic-wave resonator filter circuit having two series-arm surface-acoustic-wave resonators coupled in series with a phase shifter, and two shunt-arm surface-acoustic-wave resonators; and a two-port impedance circuit coupled in series with said two-port surface-acoustic-wave resonator filter circuit, having an impedance that creates a pole of attenuation by making an open-circuit impedance of said surface-acoustic-wave filter equal to a short-circuit impedance of said surface-acoustic-wave filter.

16. The surface-acoustic-wave filter of claim 15, wherein said two-port impedance circuit comprises a first inductor.

17. The surface-acoustic-wave filter of claim 16, wherein said first inductor comprises a bonding wire having a certain inductive impedance.

18. The surface-acoustic-wave filter of claim 16, wherein said two-port impedance circuit also comprises a first capacitor.

19. The surface-acoustic-wave filter of claim 18, wherein said first inductor and said first capacitor are coupled in parallel.

20. The surface-acoustic-wave filter of claim 19, wherein said two-port impedance circuit further comprises a second inductor coupled in series with said first capacitor and said first inductor.

21. The surface-acoustic-wave filter of claim 18, wherein said first inductor and said first capacitor are coupled in series.

22. The surface-acoustic-wave filter of claim 21, wherein said two-port impedance circuit further comprises a second capacitor coupled in parallel with said first inductor and said first capacitor.

23. The surface-acoustic-wave filter of claim 15, wherein said two shunt-arm surface-acoustic-wave resonators are coupled back-to-back, sharing a common central electrode.

24. The surface-acoustic-wave filter of claim 23, wherein said two-port impedance circuit comprises a bonding wire attached to said common central electrode.

25. The surface-acoustic-wave filter of claim 15, wherein said two-port surface-acoustic-wave resonator filter circuit and said two-port impedance circuit form a first filter section, and said surface-acoustic-wave filter further comprises a second filter section cascaded with said first filter section.

26. The surface-acoustic-wave filter of claim 25, wherein said second filter section, when combined with said a two-port surface-acoustic-wave resonator filter circuit, forms a surface-acoustic-wave ladder filter.

27. The surface-acoustic-wave filter of claim 25, wherein said second filter section is similar in configuration to said first filter section, comprising a two-port surface-acoustic-wave resonator filter circuit having two series-arm SAW resonators and two shunt-arm SAW resonators, coupled in series with a two-port impedance circuit.

28. A surface-acoustic-wave filter comprising a plurality of surface-acoustic-wave filters as described in claim 15, coupled in cascade.

* * * * *